(12) United States Patent
Yang et al.

(10) Patent No.: US 12,127,436 B2
(45) Date of Patent: Oct. 22, 2024

(54) DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Huijuan Yang, Beijing (CN); Kai Zhang, Beijing (CN); Tingliang Liu, Beijing (CN); Huijun Li, Beijing (CN); Xiaofeng Jiang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 832 days.

(21) Appl. No.: 17/252,374

(22) PCT Filed: Mar. 20, 2020

(86) PCT No.: PCT/CN2020/080483
§ 371 (c)(1),
(2) Date: Dec. 15, 2020

(87) PCT Pub. No.: WO2021/184372
PCT Pub. Date: Sep. 23, 2021

(65) Prior Publication Data
US 2022/0052133 A1   Feb. 17, 2022

(51) Int. Cl.
*H10K 59/122*   (2023.01)
*H10K 50/844*   (2023.01)
*H10K 59/131*   (2023.01)

(52) U.S. Cl.
CPC ......... *H10K 59/122* (2023.02); *H10K 50/844* (2023.02); *H10K 59/1315* (2023.02)

(58) Field of Classification Search
None
See application file for complete search history.

(56) References Cited

U.S. PATENT DOCUMENTS 9,484,547 B2   11/2016   Pyon
9,934,727 B2   4/2018   Pyon
(Continued)

FOREIGN PATENT DOCUMENTS

CN   104752439 A   7/2015
CN   104752439     12/2017
(Continued)

OTHER PUBLICATIONS

Written Opinion from PCT/CN2020/080483 dated Dec. 10, 2020.
Communication from European Application No. 20925683.3 dated Mar. 23, 2023.

*Primary Examiner* — Sarah K Salerno
(74) *Attorney, Agent, or Firm* — Calfee, Halter & Griswold LLP

(57) ABSTRACT

This disclosure provides a display panel and a display device. In the display panel, orthographic projections of a first conductive layer of the first electrode layer and the peripheral drive circuit on a plane where the drive back plate is located at least partially overlap, and the signal line is connected to the first conductive layer. The pixel definition layer includes a pixel definition area in the display area and insulating strips in the peripheral area. A separating groove exposing the first conductive layer is formed between at least two adjacent ones of the insulating strips. A second conductive layer of the second electrode layer covers the insulating strip, forms a recessed area in an area corresponding to the separating groove and is connected with the first conductive layer. The packaging layer covers the second electrode layer and fills the recessed area.

14 Claims, 22 Drawing Sheets

(56) References Cited

U.S. PATENT DOCUMENTS

| | | |
|---|---|---|
| 10,170,534 B1 | 1/2019 | Kim et al. |
| 10,446,081 B2 | 10/2019 | Pyon |
| 2015/0116295 A1 | 4/2015 | Pyon |
| 2017/0025066 A1 | 1/2017 | Pyon |
| 2017/0148391 A1 | 5/2017 | Pyon |
| 2018/0033830 A1 | 2/2018 | Kim et al. |
| 2018/0337365 A1* | 11/2018 | Harada ................ H10K 59/131 |
| 2019/0148469 A1 | 5/2019 | Lhee et al. |
| 2019/0272789 A1 | 9/2019 | Pyon |
| 2020/0052050 A1 | 2/2020 | Jiang et al. |

FOREIGN PATENT DOCUMENTS

| | | |
|---|---|---|
| CN | 104752439 B | 12/2017 |
| CN | 107665062 | 2/2018 |
| EP | 3276463 A1 | 1/2018 |
| EP | 3276463 | 3/2019 |
| EP | 3489809 | 5/2019 |

\* cited by examiner

DISPLAY PANEL AND DISPLAY DEVICE

RELATED APPLICATIONS

This application is based on International Application No. PCT/CN2020/080483, filed on Mar. 20, 2020, the entire contents of which are incorporated herein by reference in its entirety.

TECHNICAL FIELD

The present disclosure relates to the field of display technologies, in particular to a display panel and a display device.

BACKGROUND

With widespread application of OLED (Organic Light-Emitting Diode) display panel, requirements for the OLED display panel are being increased. In order to isolate the light emitting device from outside and prevent moisture and oxygen erosion, it is usually necessary to package the OLED display panel with a packaging layer. However, a packaging effect of the existing OLED display panel still needs to be improved because packaging failure is easy to occur, thus affecting the display effect.

It should be noted that the information disclosed in the above "Background" section is merely intended to reinforce understanding of the background technology of the present disclosure, accordingly the Background may include information that does not constitute the prior art as already known by an ordinary person skilled in the art.

SUMMARY

The present disclosure provides a display panel and a display device.

According to an aspect of the present disclosure, a display panel is provided. The display panel includes:
  a drive back plate having a display area and a peripheral area surrounding the display area;
  a peripheral drive circuit in the peripheral area;
  a signal line in the peripheral area and at a side of the peripheral drive circuit away from the display area;
  a first electrode layer disposed at a side of the drive back plate, and including first electrodes in the display area and a first conductive layer in the peripheral area, in which the first conductive layer and the first electrodes are on the same layer and insulated from each other, an orthographic projection of the first conductive layer and an orthographic projection of the peripheral drive circuit being at least partially overlapped on a plane where the drive back plate is located and being insulated from each other, the orthographic projection of the first conductive layer and an orthographic projection of the signal line being at least partially overlapped on the plane where the drive back plate is located, and the signal line being connected with the first conductive layer;
  a pixel definition layer including a pixel definition area in the display area and insulating strips in the peripheral area, in which the pixel definition area has openings exposing the first electrodes, the insulating strips are distributed in a direction facing away from the display area, and a separating groove exposing the first conductive layer is formed between at least two adjacent ones of the insulating strips;
  a light emitting layer at least disposed within the opening;
  a second electrode layer including a second electrode and a second conductive layer on the same layer as the second electrode, in which the second electrode is disposed at a side of the light emitting layer facing away from the drive back plate, the second conductive layer covers the insulating strips and forms a recessed area in an area corresponding to the separating groove, and is connected with the first conductive layer;
  a packaging layer covering the second electrode layer and filling the recessed area.

In an exemplary embodiment of the present disclosure, the insulating strips are substantially parallel and located in a local area of the peripheral area, and an extending direction of the insulating strips is substantially parallel to an edge of the display area corresponding to the local area.

In an exemplary embodiment of the present disclosure, the first conductive layer is provided with through holes exposing the drive back plate, the through holes are distributed in an array, and each of the insulating strips fills at least one row of the through holes and at least partially overlaps with the first conductive layer.

In an exemplary embodiment of the present disclosure, the peripheral drive circuit includes a light emitting control circuit, and orthographic projections of the insulating strips and the light emitting control circuit on the drive back plate are at least partially overlapped.

In an exemplary embodiment of the present disclosure, the peripheral drive circuit includes a light emitting control circuit, and orthographic projections of the first conductive layer and the light emitting control circuit on a plane where the drive back plate is located are at least partially overlapped and are insulated from each other.

In an exemplary embodiment of the present disclosure, the peripheral drive circuit further includes a gate drive circuit, and the light emitting control circuit is at a side of the gate drive circuit away from the display area.

In an exemplary embodiment of the present disclosure, the light emitting control circuit includes at least one light emitting control circuit signal line, and orthographic projections of the at least one light emitting control circuit signal line and at least one of the insulating strips on the drive back plate are at least partially overlapped.

In an exemplary embodiment of the present disclosure, orthographic projections of the at least one light emitting control circuit signal line and at least one of the through holes on the drive back plate are at least partially overlapped.

In an exemplary embodiment of the present disclosure, the at least one light emitting control circuit signal line includes a clock signal line including a first clock signal line and a second clock signal line adjacent to each other, the second clock signal line has a signal contrary to that of the first clock signal line, the orthographic projections of at least one of the insulating strips on the drive back plate at least partially overlap with each of orthographic projections of the first clock signal line and the second clock signal line on the drive back plate.

In an exemplary embodiment of the present disclosure, orthographic projections of at least one row of the through holes covered by the same insulating strip on the drive back plate at least partially overlap with each of the orthographic projections of the first clock signal line and the second clock signal line on the drive back plate.

In an exemplary embodiment of the present disclosure, the at least one light emitting control circuit signal line further includes a power signal line, the light emitting control circuit further includes at least one switch unit, the power signal line includes a first power signal line and a second power signal line having a signal contrary to that of the first power signal line, there is the switch unit between the first power signal line and the second power signal line, one of the first power signal line and the second power signal line is adjacent to the clock signal line, and the orthographic projection of at least one of the first power signal line and the second power signal line on the drive back plate at least partially overlaps with the orthographic projection of at least one of the insulating strips on the drive back plate.

In an exemplary embodiment of the present disclosure, the orthographic projection of at least one of the first power signal line and the second power signal line on the drive back plate at least partially overlaps with an orthographic projection of at least one of the through holes on the drive back plate.

In an exemplary embodiment of the present disclosure, at least part of a structure of the at least one switch unit at least partially overlaps with the orthographic projection of at least one of the insulating strips on the drive back plate.

In an exemplary embodiment of the present disclosure, at least part of a structure of at least one switch unit at least partially overlaps with the orthographic projection of at least one of the through hole on the drive back plate.

In an exemplary embodiment of the present disclosure, the at least one light emitting control circuit signal line further includes a starting signal line including a first starting signal line and a second starting signal line adjacent to each other, and the orthographic projection of at least one of the insulating strips on the drive back plate at least partially overlaps with each of orthographic projections of the first starting signal line and the second starting signal line on the drive back plate.

In an exemplary embodiment of the present disclosure, orthographic projections of at least one row of the through holes covered by the same insulating strip on the drive back plate at least partially overlap with each of the orthographic projections of the first starting signal line and the second starting signal line on the drive back plate.

In an exemplary embodiment of the present disclosure, in two rows of the through holes covered by two adjacent ones of the insulating strips, any one of the through holes in one row is located between two adjacent through holes in another row.

In an exemplary embodiment of the present disclosure, the drive back plate includes:
  a base;
  drive transistors disposed in the display area and connected with the first electrodes;
  a first planarization layer covering the drive transistors, the first electrode layer being on a surface of the first planarization layer facing away from the base, and the through holes exposing the first planarization layer;
  the packaging layer including:
  a first inorganic layer covering the second electrode layer and filling the recessed area;
  an organic layer disposed at a side of the first inorganic layer facing away from the base;
  a second inorganic layer covering the organic layer.

In an exemplary embodiment of the present disclosure, the drive transistor includes:
  an active layer disposed at a side of the base;
  a gate insulating layer covering the active layer;
  a first gate electrode disposed at a surface of the gate insulating layer facing away from the base;
  an insulating layer covering the first gate electrode and the gate insulating layer;
  a source-drain layer disposed at a surface of the insulating layer facing away from the base, and including a source electrode and a drain electrode connected to both ends of the active layer, in which the first planarization layer covers the source-drain layer and the insulating layer, and one of the source electrode and the drain electrode is connected with the first electrode through a via hole disposed on the first planarization layer.

In an exemplary embodiment of the present disclosure, the light emitting control circuit further includes at least one switch unit, wherein the switch unit is a thin film transistor, and an active layer of the switch unit is arranged on the same layer as an active layer of the drive transistor, a gate insulating layer of the switch unit is arranged on the same layer as a gate insulating layer of the drive transistor, a gate electrode of the switch unit is arranged on the same layer as a first gate electrode of the drive transistor, and a source electrode and a drain electrode of the switch unit are arranged on the same layer as a source-drain layer of the drive transistor.

In an exemplary embodiment of the present disclosure, a maximum width of the insulating strip in a width direction is not less than a maximum width of the through hole in the width direction of the insulating strip.

In an exemplary embodiment of the present disclosure, a difference between the maximum width of the insulating strip in the width direction and a width of the through hole in the width direction of the insulating strip is about greater than 0 and not greater than 10 nm.

In an exemplary embodiment of the present disclosure, the maximum width of the through hole in the width direction of the insulating strip is larger than a maximum interval between adjacent ones of the insulating strips in the width direction.

It should be understood that both the foregoing general description and the following detailed description are exemplary and explanatory only and are not restrictive of the disclosure.

BRIEF DESCRIPTION OF THE DRAWINGS

The accompanying drawings, which are incorporated in and constitute a part of this specification, illustrate embodiments consistent with the present disclosure and together with the description, serve to explain the principles of the present disclosure. It should be apparent that the drawings in the following description are merely examples of this disclosure, and that other drawings may be obtained by those ordinary skilled in the art without creative work.

DETAILED DESCRIPTION

Figure 1:
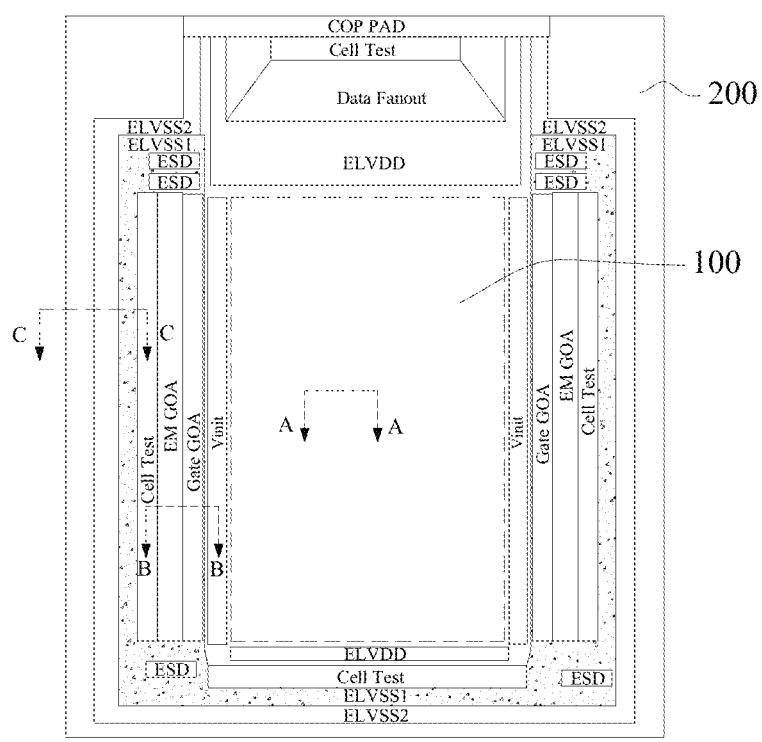
FIG. 1 is a top view of an embodiment of a display panel of the present disclosure.

Now, the exemplary embodiments will be described more fully with reference to the accompanying drawings. However, the exemplary embodiments can be embodied in a variety of forms and should not be construed as limiting the embodiments set forth herein. Instead, these embodiments are provided so that the present disclosure will be thorough and complete, and the concepts of the exemplary embodiments will be fully given to those skilled in the art. Same reference numbers denote the same or similar structures in the figures, and thus the detailed description thereof will be omitted. In addition, the drawings are merely schematic illustrations of the present disclosure, and are not necessarily drawn to scale.

The terms "a", "an", "the", "said" and "at least one", are used to express the presence of one or more the element/constitute/ or the like. The terms "comprise", "include" and "have" are intended to be inclusive, and mean there may be additional elements/constituents/ or the like other than the listed elements/constituents/ or the like. The "first" and "second" are used only as marks, and are not numerical restriction to the objects.

In this disclosure, unless otherwise specified, the term "disposed on the same layer" means that two layers, components, members, elements or parts may be formed by the same patterning process, and these two layers, components, members, elements or parts are generally formed of the same material.

In this disclosure, unless otherwise specified, the expression "patterning process" generally includes steps of photoresist coating, exposure, development, etching, photoresist stripping and the like. The expression "one-time patterning process" means a process of forming patterned layers, components, members, etc. using one mask plate.

In the related art, the OLED display panel includes a drive back plate, a light emitting device disposed on the drive back plate, and a packaging layer covering the light emitting device. The drive back plate has a display area and a peripheral area surrounding the display area, and the peripheral area has a peripheral drive circuit, such as a GOA (gate driver on array) circuit. The organic packaging layer in the packaging layer may be formed by an ink jet printing (IJP) process; however, when the packaging layer is formed, the packaging material in the peripheral area may overflow, to easily cause the packaging failure and affect the display effect.

Embodiments of the present disclosure provide a display panel, which may be an OLED display panel, such as an AMOLED (active-matrix organic light-emitting diode) display panel.

As shown in FIGS. 1-7, the display panel of an embodiment of the present disclosure may include a drive back plate 1, a peripheral drive circuit, a signal line 130, a first electrode layer 2, a pixel definition layer 3, a light emitting layer 4, a second electrode layer 5 and a packaging layer 6.

The drive back plate 1 has a display area 100 and a peripheral area 200 surrounding the display area 100. The peripheral drive circuit is located in the peripheral area 200. The signal line 130 is located in the peripheral area 200 and at a side of the peripheral drive circuit away from display area 100.

The first electrode layer 2 is disposed at a side of the drive back plate 1, and includes a first electrode 21 in the display area 100 and a first conductive layer 22 in the peripheral area 200. The first conductive layer 22 and the first electrode 21 are disposed on the same layer, orthographic projections of the first conductive layer 22 and the peripheral drive circuit on a plane where the drive back plate 1 is located at least partially overlap, and the first conductive layer 22 is insulated from the peripheral drive circuit. Meanwhile, orthographic projections of the first conductive layer 22 and the signal line 130 on the plane where the drive back plate 1 is located at least partially overlap, and the first conductive layer 22 is connected with the signal line 130. The first electrode 21 in the display area 100 and the first conductive layer 22 in the peripheral area 200 are insulated from each other. The first electrode 21 in the display area 100 and the first conductive layer 22 in the peripheral area 200 are on the same layer and include the same material, and may be simultaneously formed in the manufacturing process.

Figure 4:
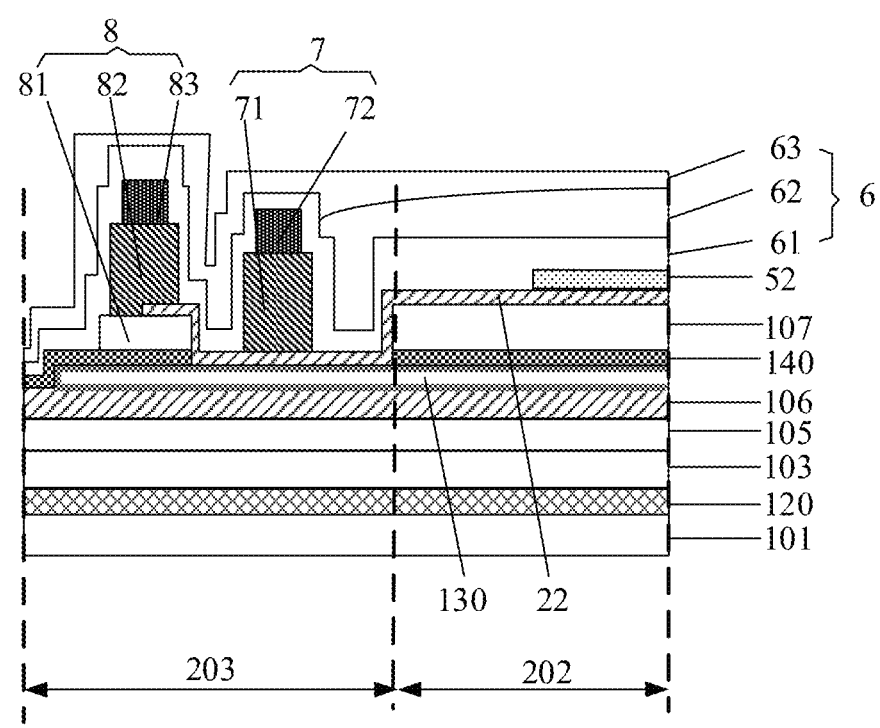
FIG. 4 is a cross-sectional view of an embodiment of the display panel shown in FIG. 1 taken along a line C-C.

In some embodiments, the second conductive layer 22 of the peripheral area 200 extends from a position corresponding to the peripheral drive circuit to a position corresponding to the signal line 130. As shown in FIG. 4, in some of the embodiments, the second conductive layer 52 extends to a position where the first package dam 7 and the second package dam 8 are located, and at least partially overlaps with the orthographic projection of the first package dam 7 and/or the second package dam 8 on the plane where the drive back plate 1 is located.

Figure 2:
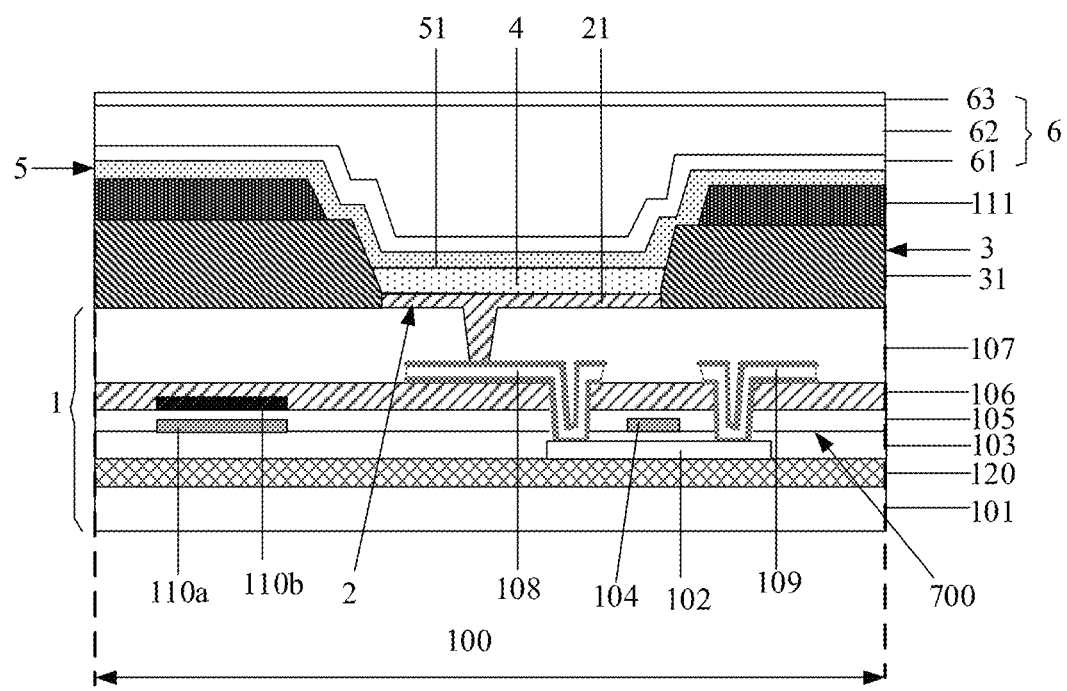
FIG. 2 is a cross-sectional view of an embodiment of the display panel shown in FIG. 1 taken along a line A-A.
Figure 5:
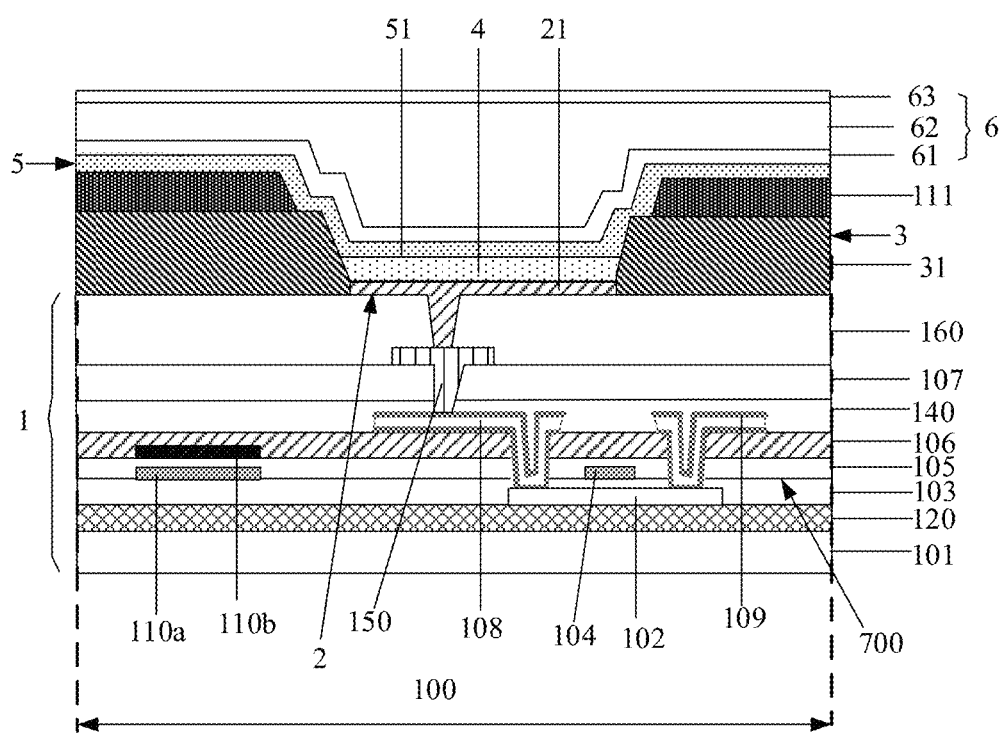
FIG. 5 is a cross-sectional view of another embodiment of the display panel shown in FIG. 1 taken along a line A-A.
Figure 8:
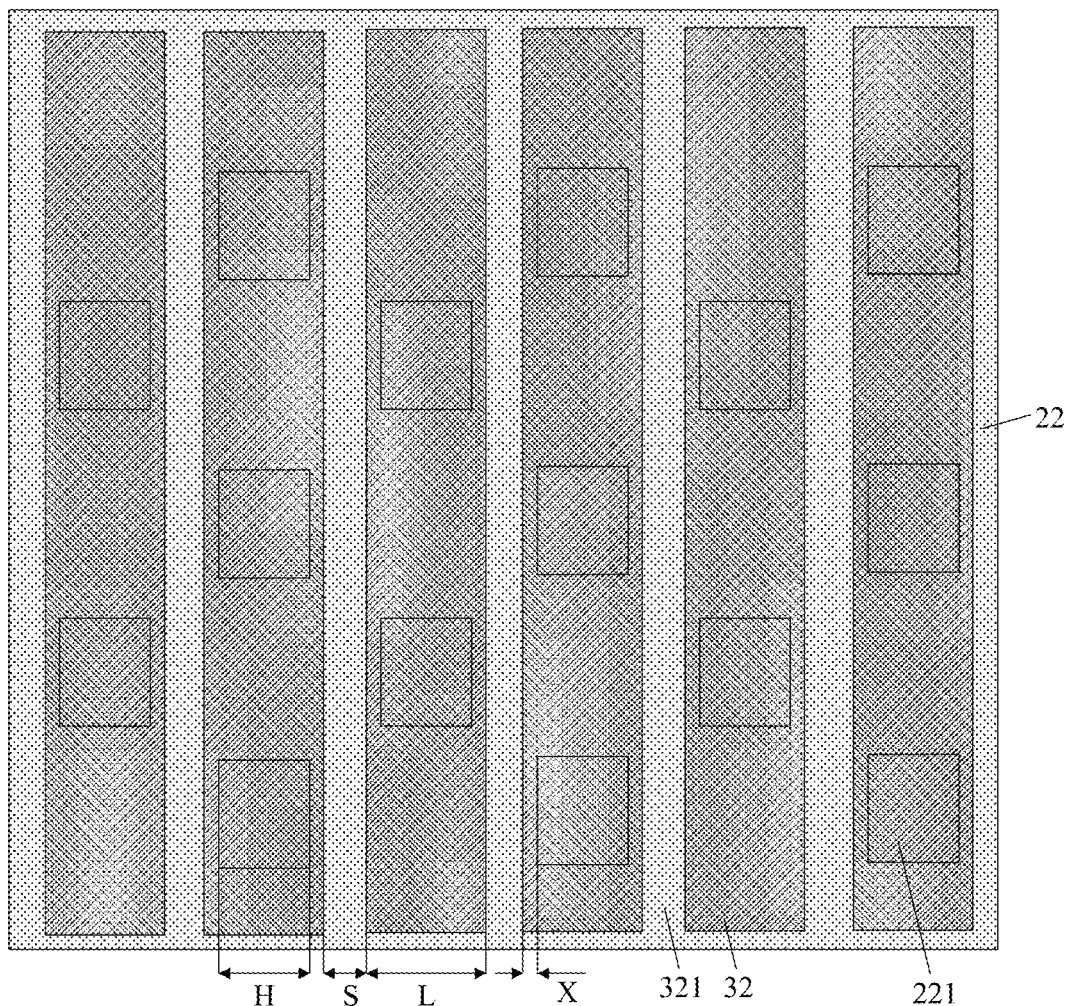
FIG. 8 is a schematic distribution view of a first conductive layer and insulating strips in an embodiment of a display panel of the present disclosure.

As shown in FIGS. 2, 5 and 8, the pixel definition layer 3 includes a pixel definition area 31 in the display area 100 and a plurality of insulating strips 32 in the peripheral area 200. That is, the pixel definition area 31 in the display area 100 and a plurality of insulating strips 32 in the peripheral area 200 are arranged on the same layer and include the same material, and may be simultaneously formed in the manufacturing process. The pixel definition area 31 has a plurality of openings exposing the first electrode 21. A plurality of insulating strips 32 are substantially distributed in parallel along a direction facing away from the display area 100, and a separating groove 321 exposing the first conductive layer 22 is formed between at least two adjacent ones of the insulating strips 32. The "substantially distributed in parallel" includes completely paralleling and paralleling within a certain range of process error.

The light emitting layer 4 is at least disposed in a plurality of openings.

The second electrode layer 5 includes a second electrode 51 and a second conductive layer 52 on the same layer as the second electrode 51. The second electrode 51 is disposed at a side of the light emitting layer 4 facing away from the drive back plate 1. The second conductive layer 52 covers the insulating strip 32 and forms a recessed area 521 in an area corresponding to the separating groove 321, and is connected to the first conductive layer 22. The second electrode 51 is connected to the second conductive layer 52 on the same layer as the second electrode 51. In some of the embodiments, the second electrode 51 extends from the display area 100 to a position corresponding to the peripheral drive circuit (a structural mark of the corresponding second electrode layer 2 is the second conductive layer 52 herein) and further extends to connect with the first conductive layer 22 in the peripheral area 200. The packaging layer 6 covers the second electrode layer 5 and fills the recessed area 521.

According to the display panel of the embodiment of the present disclosure, within a range of the display area 100, the pixel definition area 31 may define a plurality of light emitting units through the opening, specifically, one light emitting unit may be formed at a part of the first electrode 21, the light emitting layer 4 and the second electrode 51 corresponding to the opening. The drive back plate 1 has a drive transistor connected with the light emitting unit in the display area 100. There is a peripheral drive circuit including a drive transistor in the peripheral area 200. The light emitting unit may be driven by the peripheral drive circuit and the drive transistor to emit light.

Figure 3:
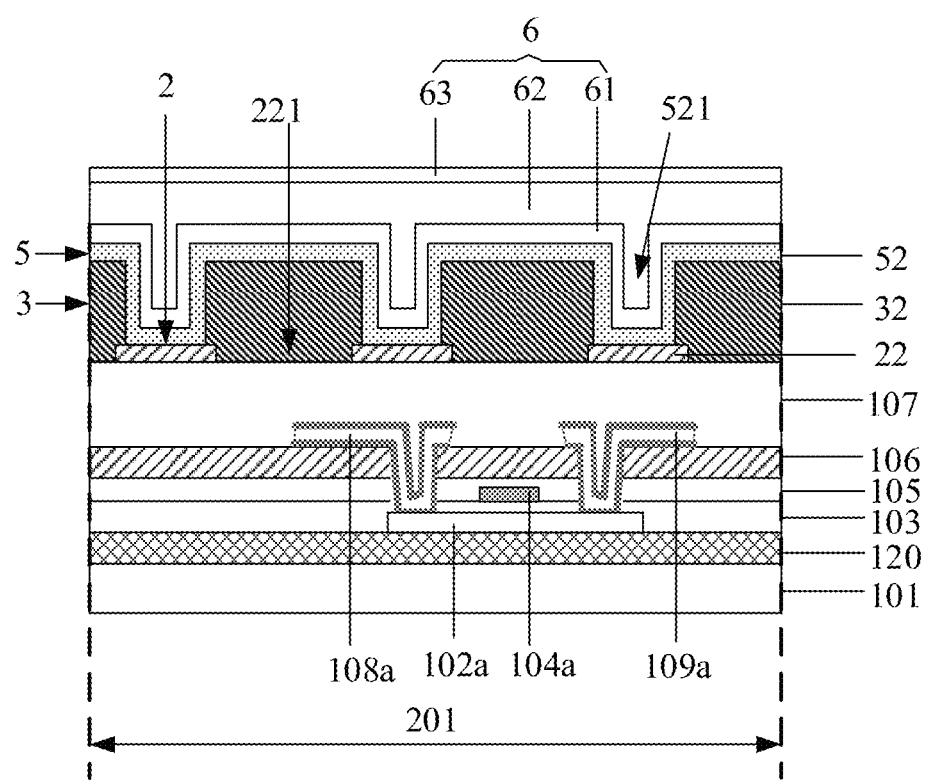
FIG. 3 is a cross-sectional view of an embodiment of the display panel shown in FIG. 1 taken along a line B-B.

As shown in FIGS. 3 and 8, in the peripheral area 200, a separating groove 321 is formed between two adjacent ones of the insulating strips 32, and the second conductive layer 52 is recessed at an area of the separating groove 321 to form a recessed area 521, so that the first conductive layer 22 is lapped with the second conductive layer 52. As forming the packaging layer 6, the flowing organic material in the packaging layer 6 can be blocked by the recessed areas 521 to prevent the organic material in the packaging layer 6 from overflowing, so as to facilitate improving the packaging effect and ensuring the display effect.

Hereinafter, the parts of the display panel according to the embodiments of the present disclosure will be described in detail.

As shown in FIGS. 1-4, the drive back plate 1 has a display area 100 and a peripheral area 200. The peripheral area 200 is disposed around the display area 100, and the peripheral area 200 includes a circuit area 201, a wiring area 202 and a packaging area 203 distributed along the direction facing away from the display area 100. The packaging area 203 may be located at the outermost edge of the whole drive back plate 1 for packaging the whole display panel.

The display area 100 may be provided with a pixel circuit including a plurality of drive transistors 700, and the drive transistors 700 may be used to connect with first electrode connections 21 to drive light emitting devices.

For example, the drive back plate 1 includes a base 101 and a drive transistor 700 at a side of the base 101.

As shown in FIG. 2, the base 101 may be a hard or soft transparent substrate, and may have a single-layer or multi-layer structure. The base 101 may be a flexible substrate to improve the flexibility of the drive back plate 1, so that the drive back plate 1 may be, for example bendable and foldable, so as to expand the application of the drive back plate 1, which however is not limited thereto, the base 101 may also be configured to be rigid, and the specific performance of the base 101 may be determined according to the actual requirements of products.

The drive transistor 700 may be a top gate or a bottom gate structure. Taking the top gate structure as an example, the drive transistor 700 is located in the display area 100 and includes an active layer 102, a first gate insulating layer 103, a first gate electrode 104, a second gate insulating layer 105, a source-drain layer (including a source electrode 108 and a drain electrode 109), a dielectric layer 106, and a first planarization layer 107. In some of the embodiments, a passivation layer between the source-drain layer and the first planarization layer 107 may also be included.

As shown in FIG. 2, the active layer 102 may be disposed at a side of the base 101 and located in the display area 100. The first gate insulating layer 103 covers the active layer 102 and the base 101. The first gate electrode 104 is disposed at a surface of the first gate insulating layer 103 facing away from the base 101. The second gate insulating layer 105 may cover the first gate electrode 104 and the first gate insulating layer 103, and the second gate insulating layer 105 may have a single-layer or multi-layer structure, which is not particularly limited herein.

The dielectric layer 106 covers the second gate insulating layer 105. The dielectric layer 106, the first gate insulating layer 103 and the second gate insulating layer 105 are also located in the circuit area 201, the wiring area 202 and the packaging area 203. In some embodiments, the passivation layer is also located in the circuit area 201, the wiring area 202 and the packaging area 203.

The source-drain layer is disposed at a side of the dielectric layer 106 facing away from the base 101 and includes a source electrode 108 and a drain electrode 109. The source electrode 108 and the drain electrode 109 may include a metal material or an alloy material, for example, a metal single-layer or multi-layer structure formed of molybdenum, aluminum, titanium, or the like. For example, the multi-layer structure is a multi-metal laminated layer, such as titanium/aluminum/titanium three-layer metal laminated layer (Al/Ti/Al), or the like. The source electrode 108 and the drain electrode 109 are connected to both ends of the active layer 102 through via holes penetrating through the dielectric layer 106, the second gate insulating layer 105, and the first gate insulating layer 103. The first planarization layer 107 covers the dielectric layer 106, the first electrode layer 2 is disposed at a side of the first planarization layer 107 facing away from the base 101, and one of the source electrode 108 and the drain electrode 109 is connected to the first electrode 21 through a via hole provided in the first planarization layer 107. In some of the embodiments, one of the source electrode 108 and the drain electrode 109 is connected to the first electrode 21 through via holes provided in the first planarization layer 107 and the passivation layer.

In addition, in order to block moisture, oxygen and alkaline ions, a buffer layer 120 may be formed on the base 101. The active layer 102 is located at a side of the buffer layer 120 facing away from the base 101, and the first gate insulating layer 103 covers the buffer layer 120 and the active layer 102. For example, the base 101 may be made of polyimide, and the buffer layer 120 may be made of silicon nitride, silicon oxide and other materials. It should be noted that structures of the base 101 and the buffer layer 120 are not limited thereto, and may be determined according to actual requirements.

As shown in FIG. 5, in other embodiments of the present disclosure, the drive back plate 1 further includes a transfer electrode 150 and a second planarization layer 160. The transfer electrode 150 is disposed at a side of the first planarization layer 107 facing away from the base 101, and the transfer electrode 150 is connected with the drain electrode 109 or the source electrode 108 through a via hole penetrating through the first planarization layer 107. The second planarization layer 160 covers the transfer electrode 150, and the first electrode layer 2 may be disposed at a surface of the second planarization layer 160 facing away from the base 101 and connected with the transfer electrode 150 through a via hole penetrating through the second planarization layer 160.

In some embodiments, a passivation layer (PVX) 140 may further be formed between the first planarization layer 107 and the dielectric layer 106. The passivation layer 140 may be made of silicon oxide, silicon nitride, silicon oxynitride or other materials. The passivation layer 140 covers the source electrode 108 and the drain electrode 109. It should be noted that the passivation layer 140 may be formed between the first planarization layer 107 and the dielectric layer 106 when the second planarization layer 160 is not provided. The transfer electrode 150 is formed between the first planarization layer 107 and the second planarization layer 160, and is electrically connected to the drain electrode 109 or the source electrode 108 successively through via holes (such as metal via holes) in the first planarization layer 107 and the passivation layer 140. The first electrode 21 may be electrically connected to the transfer electrode 150 through a via hole (e.g., a metal via hole) in the second planarization layer 160, as shown in FIG. 5.

In some of the embodiments, the transfer electrode 150 may further be formed between the first planarization layer 107 and the passivation layer 140.

The light emitting unit formed by the first electrode 21, the light emitting layer 4 and the second electrode 51 is located on the drive back plate 1 and is driven by the pixel circuit to emit light.

In some embodiments of the present disclosure, in a pixel circuit structure such as 7T1C, the drive back plate 1 may further include a storage capacitor that includes a first electrode plate 110a and a second electrode plate 110b. The first electrode plate 110a may be manufactured on the same layer as the first gate electrode 104 by using the same material and process as that of the first gate electrode 104, and the second electrode plate 110b is disposed on a surface of the second gate insulating layer 105 facing away from the base 1 and covered by the dielectric layer 106.

In some embodiments, the drive back plate 1 may further include a second gate electrode disposed at a side of the first gate electrode 104 facing away from the base 101. A second gate insulating layer 105 is disposed between the first gate electrode 104 and the second gate electrode. The second electrode plate 110b may be manufactured on the same layer as the second gate electrode by using the same material and process as that of the second gate electrode.

In some embodiments of the present disclosure, as shown in FIGS. 2-4, a support 111 may be further provided at a side of the pixel definition layer 3 facing away from the dielectric layer 106. The support 111 plays a role of supporting a protective film layer (not shown), so as to avoid the situation that the protective film layer is in contact with the first electrode 21 or other wirings to cause the first electrode 21 or other wirings to be easily damaged. It should be noted that this protective film layer mainly appears in the transfer process of semi-finished products to avoid the damage of semi-finished products during the transfer process. Specifically, a protective film layer may be covered during the process of transferring the substrate with the manufactured support 111 to the evaporation production line, and the protective film layer can be removed when evaporation of the light-emitting material is required.

In some embodiments, the material of the support 111 may be the same as that of the pixel definition layer 3. The support 111 and the pixel definition layer 3 may be formed by the same patterning process. In other embodiments, the material of the support 111 may be different from that of the pixel definition layer 3. In other embodiments, the support 111 and the pixel definition layer 3 may also be formed by different patterning processes.

As shown in FIGS. 1 and 3, the peripheral drive circuit is located in the circuit area 201 within the peripheral area 200, and at least one of the light emitting control circuit and the gate drive circuit is included in the circuit area 201, and both of the light emitting control circuit and the gate drive circuit may be connected with the pixel circuit to drive the light emitting device to emit light.

As shown in FIG. 4, the signal line 130 is located in the peripheral area 200 and at a side of the peripheral drive circuit away from the display area 100. The signal line 130 may be arranged on the same layer as the source-drain layer and include the same material, and is connected with the second conductive layer 52 to input a signal to the second electrode 51.

As shown in FIGS. 2-4, the first electrode layer 2 is disposed at a side of the drive back plate 1, and includes a first electrode 21 and a first conductive layer 22. The first electrode 21 is located in the display area 100. The first conductive layer 22 is located in the peripheral area 200 and corresponds to the peripheral drive circuit. That is, orthographic projections of the first conductive layer 22 and the peripheral drive circuit on the plane where the drive back plate 1 is located at least partially overlap, and the first conductive layer 22 is insulated from the peripheral drive circuit. Meanwhile, orthographic projections of the first conductive layer 22 and the signal line 130 on the plane where the drive back plate 1 is located at least partially overlap, and the signal line 130 is connected to the first conductive layer 22 to serve as a transfer electrode connecting the signal line 130 and the second conductive layer 52.

Figure 9:
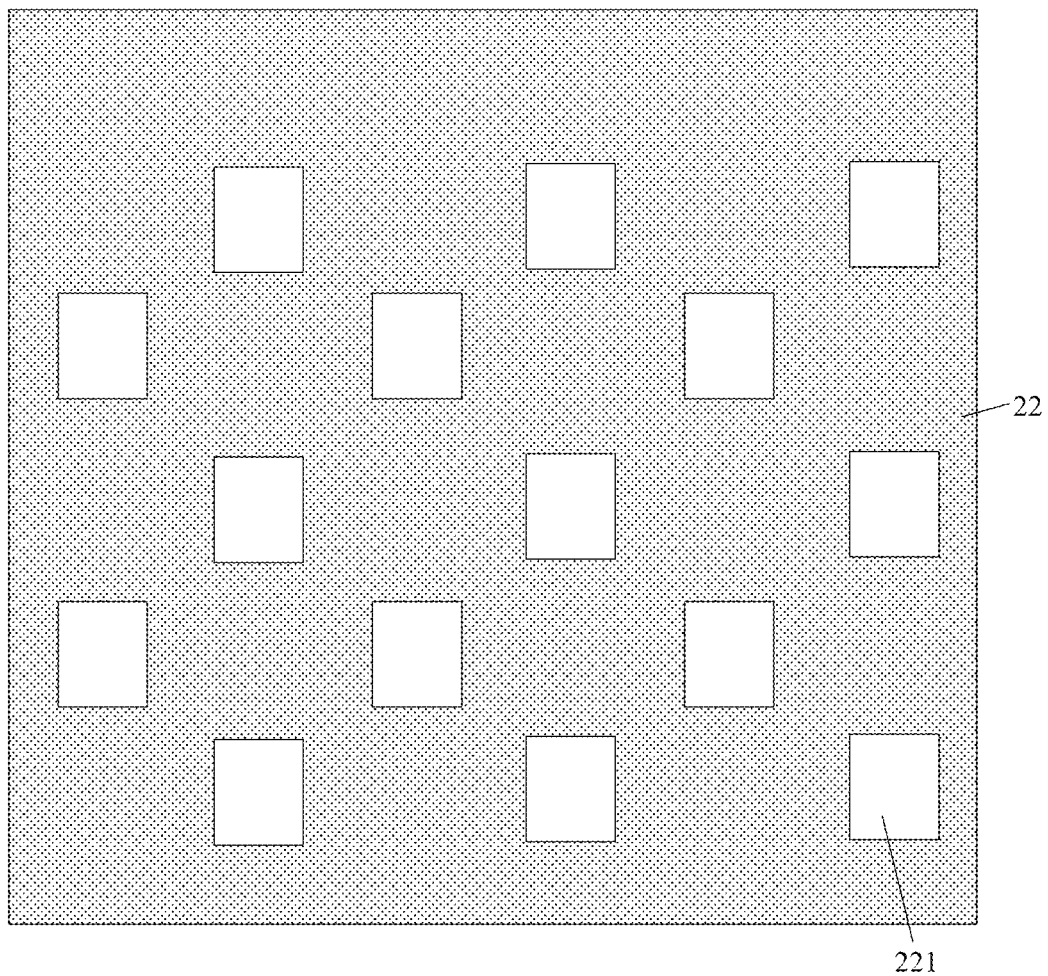
FIG. 9 is a top view of a first conductive layer in an embodiment of a display panel of the present disclosure.

In some embodiments of the present disclosure, as shown in FIGS. 3, 8 and 9, the first conductive layer 22 is disposed on the surface of the first planarization layer 107 facing away from the base 101. In order to facilitate discharging gases released by the first planarization layer 107, a plurality of through holes 221 distributed in an array may be provided in the first conductive layer 22, and the drive back plate 1 is exposed from the through holes 221 for discharging gases. The shape of the through hole 221 may be at least one or a combination of any shapes such as a rectangle, a circle and a triangle, which is not particularly limited thereto.

Figure 6:
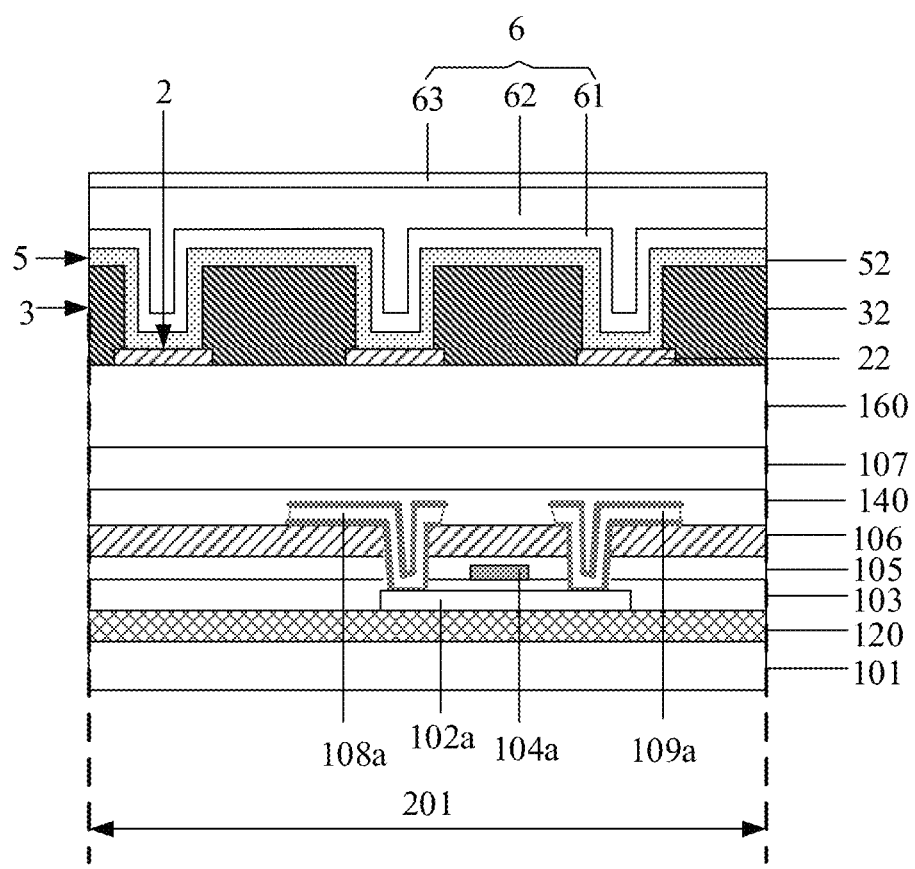
FIG. 6 is a cross-sectional view of another embodiment of the display panel shown in FIG. 1 taken along a line B-B.

As shown in FIG. 6, in other embodiments of the present disclosure, the first conductive layer 22 is disposed on the surface of the second planarization layer 160 facing away from the base 101, and the through hole 221 may be used to discharge gases released by the second planarization layer 160.

As shown in FIGS. 2, 3, 5, 6, 8 and 9, the pixel definition layer 3 may partially cover the first electrode layer 2, and includes a pixel definition area 31 and a plurality of insulating strips 32. The pixel definition area 31 is located in the display area 100 and has a plurality of openings exposing the first electrodes 21 in one-to-one correspondence.

The insulating strips 32 are located in the peripheral area 200 and may be located in a local area of the peripheral area 200. The extending directions of a plurality of insulating strips 32 are substantially parallel to a direction of the edge of the display area 100 corresponding to the local area, and the insulating strips 32 are distributed in a direction facing away from the display area 100. The "substantially parallel" includes strictly paralleling and paralleling within a certain range of process error. In some of the embodiments, as shown in FIG. 1, the display area 100 may include a long-side direction which is an up-down direction as shown, and a short-side direction which is a left-right direction as shown. Each of a plurality of insulating strips 32 extends along the long-side direction and are arranged in parallel along the short-side direction.

As shown in FIG. 8, a separating groove 321 exposing the first conductive layer 22 is formed between at least two adjacent ones of the insulating strips 32, so that the separating grooves 321 are distributed and spaced apart in the direction facing away from the display area 100.

In some of the embodiments, each of a plurality of separating grooves 321 extends along the long-side direction, and the separating grooves are arranged in parallel along the short-side direction.

At least one insulating strip 32 fills at least one row of through holes 221, and the insulating strip 32 at least partially overlaps with the first conductive layer 22.

As shown in FIG. 8, a row of through holes 221 are substantially aligned in the long-side direction, and the "aligned" includes full alignment and alignment within a range of process error. In other embodiments, the row of through holes 221 may be randomly arranged in the long-side direction.

At least two rows of through holes 221 covered by two adjacent ones of the insulating strips 32 are staggered. As shown in FIG. 8, the two rows of through holes 221 covered by any two adjacent ones of the insulating strips 32 are staggered, that is, in the two rows of through holes 221 covered by any two adjacent ones of the insulating strips 32, any one of the through holes in one row is located between nearest two through holes 221 in another row.

In some of the embodiments, two rows of through holes 221 covered by two partially adjacent insulating strips 32 are staggered, and two rows of through holes 221 covered by two partially adjacent insulating strips 32 are aligned.

In some of the embodiments, two rows of through holes 221 covered by two adjacent ones of the insulating strips 32 are aligned, that is, they are substantially aligned in the short-side direction, including full alignment and alignment within the range of process error.

In other embodiments, the row of through holes 221 is substantially aligned in the short-side direction, including full alignment and alignment within the range of process error. In other embodiments, the row of through holes 221 may be arbitrarily arranged in the short-side direction.

In some embodiments of the present disclosure, the insulating strips 32 may extend in a direction substantially parallel to an edge of the display area 100 and may be distributed in a direction facing away from the display area 100. For example, the display area 100 has a rectangular shape and has two opposite long sides and two opposite short sides. The insulating strips 32 are located in an area of the peripheral area 200 corresponding to one short side of the display area 100, and are parallel to the short side and distributed in the direction facing away from the display area 100. A separating groove 321 is formed between two adjacent ones of the insulating strips 32.

When other film layers such as the second electrode layer 5 after the pixel definition layer 3 are formed, metal precipitation in the first conductive layer 22 may be caused by an etching process, and when the precipitated metal moves into the display area 100, there will be dark spots in the display image. In order to solve this problem, the through hole 221 may be covered by the insulating strip 32, and the first conductive layer 22 may be protected during the subsequent process. For example, in some embodiments of the present disclosure, as shown in FIG. 8, each of the insulating strips 32 covers and fills at least one row of through holes 221, thereby reducing the risk of creating dark spots while ensuring the exhaust function.

As shown in FIG. 8, FIG. 8 shows a distribution of the insulating strips 32 and the through holes 221, wherein the through hole 221 is rectangular, and the maximum distance between two side walls of the through hole 221 in the width direction of the insulating strip 32, that is, the width of the through hole 221 is H; the maximum width of insulating strip 32 is L; a distance between the side wall of the through hole 221 and the insulating strip 32 is X, which is half of the difference between the width of the insulating strip 32 in the width direction and the width of the through hole 221 in the width direction of the insulating strip 32; the interval between two adjacent ones of the insulating strips 32, that is, the maximum width of the separating groove 321 is S.

Exemplarily, H is about 20-25 nm, L is about 25-30 nm, L is greater than or equal to H, the difference between the width of the insulating strip 32 in the width direction and the width of the through hole 221 in the width direction of the insulating strip 32 is about 0 nm-10 nm, X is about 0 nm-5 nm, and S is about 0 nm-10 nm.

Exemplarily, H is about 22-23 nm, L is about 26-28 nm, L is greater than or equal to H, the difference between the width of the insulating strip 32 in the width direction and the width of the through hole 221 in the width direction of the insulating strip 32 is about 3 nm-5 nm, X is about 1.5 nm-2.5 nm, and S is about 3 nm-8 nm.

Exemplarily, H may be about 22.5 nm, L may be about 26.5 nm, X may be about 2 nm, and S may be about 7.99 nm.

Exemplarily, H may be about 21.5 nm, L may be about 25.5 nm, X may be about 2 nm, and S may be about 6.99 nm.

The word "about" can be understood to include values within the range of process and/or measurement errors.

As shown in FIG. 2, the light emitting layer 4 is at least disposed in the opening of the pixel definition area 31 and is laminated on the first electrode 21. For example, the light emitting layer 4 is only filled in the opening and laminated on the first electrode 21. Alternatively, the light emitting layer 4 includes not only a part filled in the opening, but also a part located on the surface of the pixel definition area 31 at a side away from the drive back plate 1.

The light emitting layer 4 may include a hole injection layer, a hole transport layer, a light emitting material layer, an electron transport layer, and an electron injection layer sequentially laminated on the first electrode 21. In other embodiments, the light emitting layer may also include other functional layers.

As shown in FIGS. 2-4, the second electrode layer 5 may be disposed at a side of the light emitting layer 4 facing away from the drive back plate 1, and includes a second electrode 51 and a second conductive layer 52. The second electrode 51 is connected with the second conductive layer 52, the second electrode 51 is located on a surface of the light emitting layer 4 facing away from the drive back plate 1, the second conductive layer 52 covers the insulating strip 32 and forms a recessed area 521 in the area corresponding to the separating groove 321, thereby lapping with the first conductive layer 22. Further, in the wiring area 202, the second conductive layer 52 is lapped with the first conductive layer 22, so that the second electrode 51 is connected with the signal line 130 through the second conductive layer 52 and the first conductive layer 22, to apply a driving signal (e.g., VSS signal) to the second electrode 51 through a chip or the like.

As shown in FIGS. 2-4, the packaging layer 6 may cover the second conductive layer 52 and fill the recessed area 521. The packaging layer 6 may include an organic material, and as forming the organic material of the packaging layer 6, inkjet printing or other processes may be used, and the recessed areas 521 of the second electrode layer 5 may block packaging layer 6, to reduce the risk of overflow of the organic material of the packaging layer 6, avoid the packaging failure and ensure the display effect.

Figure 7:
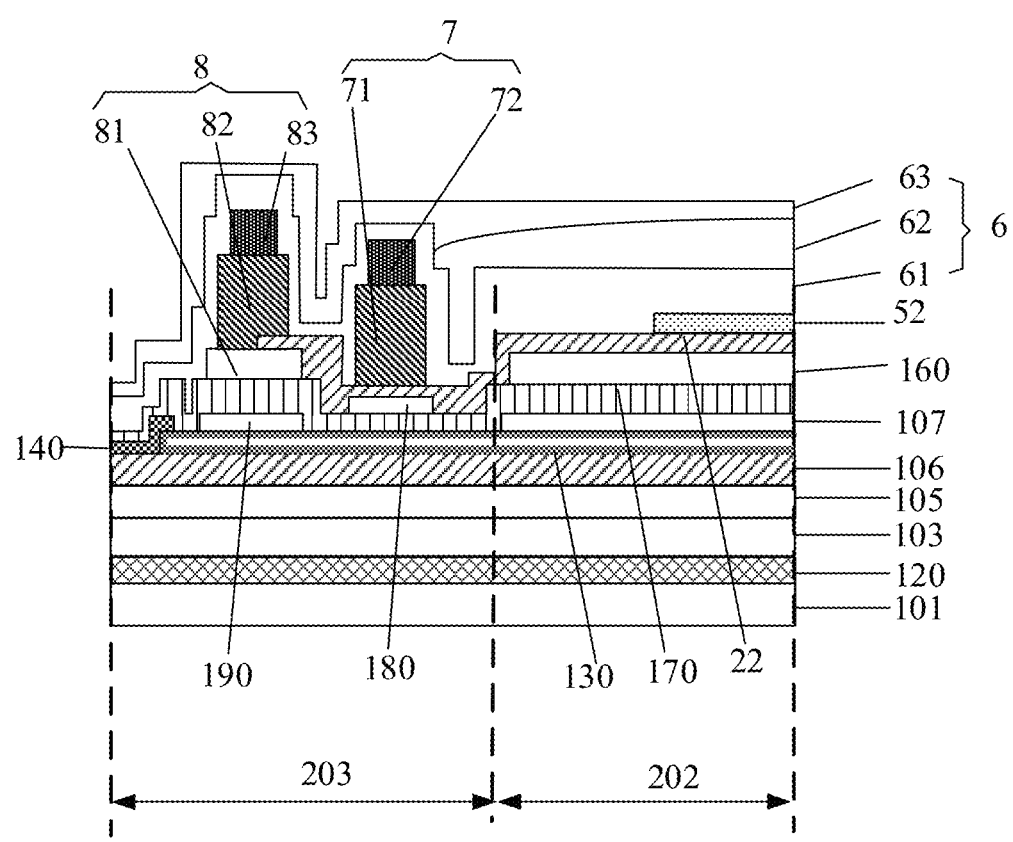
FIG. 7 is a cross-sectional view of another embodiment of the display panel shown in FIG. 1 taken along a line C-C.

In some embodiments of the present disclosure, as shown in FIGS. 4 and 7, the drive back plate 1 includes a first package dam 7 and a second package dam 8 located in the package area 203. The first package dam 7 and the second package dam 8 may be located at a side of the signal line 130 facing away from the base 101 and at a side of the peripheral drive circuit facing away from the display area 100. The first packaging dam 7 and the second packaging dam 8 may be annular structures and are concentrically arranged around the display area 100, and the second packaging dam 8 surrounds the first packaging dam 7.

In some embodiments, as shown in FIG. 4, the thickness of the second packaging dam 8 is greater than that of the first packaging dam 7. The first package dam 7 may include a first barrier portion 71 and a first spacer portion 72 sequentially formed on the dielectric layer 106. The second packaging dam 8 may include a protection portion 81, a second barrier portion 82 and a second spacer portion 83 sequentially formed on the dielectric layer 106.

As shown in FIGS. 3, 6 and 8, in some embodiments of the present disclosure, the packaging layer 6 may include a first inorganic packaging layer 61, an organic packaging layer 62 and a second inorganic packaging layer 63 which are sequentially laminated. The first inorganic packaging layer 61 packages the light-emitting devices, the first packaging dam 7 and the second packaging dam 8; and the organic packaging layer 62 packages the light-emitting devices and is interrupted at a side of the first packaging dam 7 close to the display area 100. The second inorganic packaging layer 63 packages the light emitting devices and the first packaging dam 7 and the second packaging dam 8. The first inorganic packaging layer 61 and the second inorganic packaging layer 63 are used to prevent moisture and oxygen from entering the display area 100. The first inorganic packaging layer 61 and the second inorganic packaging layer 63 may be made of inorganic materials such as silicon nitride and silicon oxide. The organic packaging layer 62 is used to realize planarization, so as to facilitate the manufacturing of the second inorganic packaging layer 63. The organic packaging layer 62 may be made of acrylic-based polymer, silicon-base polymer, or other materials.

The first inorganic packaging layer 61 and the second inorganic packaging layer 63 may be made by chemical vapor deposition, which is not limited thereto, and may also be made by physical vapor deposition or the like. While the organic packaging layer 62 is manufactured by the inkjet printing process, which is not limited thereto, spraying and coating process may also be used. In the process of manufacturing the organic packaging layer 62, the organic packaging material has a certain fluidity, so that the flow of the organic packaging material may be restricted by the first barrier portion 71, and at the same time, the separating groove 321 between the insulating strips 32 will make the first inorganic packaging layer 61 recessed at the position of the separating groove 321, to form a plurality of recesses, and the flow of the organic packaging material may also be restricted to avoid the problem of packaging failure caused by the organic packaging material flowing outside the display panel.

In some embodiments, the protection portion 81 may be disposed on the same layer as a planarization portion 116 of the display area 100, and the first barrier portion 71 and the second barrier portion 82 may be disposed on the same layer as the pixel definition layer 3 of the display area 100. The first spacer portion 72 and the second spacer portion 83 may be disposed on the same layer as the support 111 of the display area 100.

It should be noted that the first packaging dam 7 may also include a protection portion located between the dielectric layer 106 and the first barrier portion 71 and disposed on the same layer as the first planarization layer 107 or the second planarization layer 160, depending on the specific circumstances.

In some embodiments, as shown in FIG. 4, the signal line 130 may be disposed on the same layer as the source electrode 108 and the drain electrode 109, and the first conductive layer 22 and the first electrode 21 may be disposed on the same layer. An end of the signal line 130 may extend to the package area 203, and the signal line 130 may be located below the first package dam 7 and the second package dam 8. An end of the first conductive layer 22 may extend to the packaging area 203 and be located between the protection portion 81 and the second barrier portion 82 in the second packaging dam 8.

It should be noted that, in some embodiments, a passivation layer 140 may also be manufactured after manufacturing the source-drain layer and before manufacturing the planarization layer. After patterning, the passivation layer 140 may not only include a portion located in the display area 100, as shown in FIGS. 2-4; but also include a part located in the wiring area 202 and the package area 203, as shown in FIG. 4. However, it should be understood that in some embodiments, after the source-drain layer is manufactured, the planarization layer may also be directly manufactured without manufacturing the passivation layer 140; or after the passivation layer 140 is patterned, the passivation layer 140 may include a part located in the display area 100, but there is no part of the structure of the passivation layer 140 in the wiring area 202 and the package area 203, depending on the specific requirements.

As shown in FIG. 4, the first conductive layer 22 may be electrically connected with the signal line 130 located in the wiring area 202 through via holes, specifically, the first conductive layer 22 may contact with the signal line 130 below the first packaging dam 7 to realize electrical connection, which is not limited thereto. The first conductive layer 22 may also be electrically connected with the second conductive layer 52 located in the wiring area 202. This signal line 130 may be a VSS power line, or the like, which is not limited thereto.

In some embodiments, as shown in FIG. 7, the drive circuit layer further includes a signal line 130, a first conductive layer 22 and a transfer line 170 in the wiring area 202. The signal line 130 may be disposed on the same layer as the source electrode 108 and the drain electrode 109, the first conductive layer 22 may be disposed on the same layer as the first electrode 21; the transfer line 170 may be disposed on the same layer as the transfer electrode 150 of the display area 100. An end of the signal line 130 may extend to the package area 203, and the signal line 130 may be located below the first package dam 7 and the second package dam 8, and an end of the first conductive layer 22 may extend to the package area 203 and be located between the protection portion 83 and the second barrier portion 82 in the second package dam 8. An end of the transfer line 170 may extend to the package area 203, and the transfer line 170 may be located below the first package dam 7 and the second package dam 8.

In addition, as shown in FIG. 7, in the embodiment of the present disclosure, the transfer line 170 disposed on the same layer as the transfer electrode 150 is provided in the wiring area 202 and the packaging area 203. The first planarization layer 107 is manufactured before the transfer line 170 and the transfer electrode 150 are manufactured, wherein the first planarization layer 107 may be patterned to form a first planarization film layer located in the display area 100 and the wiring area 202 and a second pattern block 190 located in the packaging area 203 (as shown in FIG. 4), the second pattern block 190 is located below the second packaging dam 8 to raise the second packaging dam 8; this second planarization layer is manufactured after the transfer line 170 and the transfer electrode 150 are manufactured, wherein the second planarization layer 160 may be patterned to form a second planarization film layer located in the display area 100 and the wiring area 202, and a first pattern block 180 and a protection portion 83 located in the packaging area 203. The first pattern block 180 is located below the first packaging dam 7 to raise the first packaging dam 7.

It should be noted that, in some embodiments, a passivation layer 140 may also be manufactured after the source-drain layer is manufactured and before the planarization layer is manufactured. After patterning, the passivation layer 140 may not only include a part located in the display area 100, as shown in FIG. 2; but also include a part located in the package area 203, as shown in FIG. 7.

It should be understood that in some embodiments, after the source-drain layer is manufactured, the planarization layer may also be directly manufactured without manufacturing the passivation layer 140; or after the passivation layer 140 is patterned, the passivation layer 140 may include a part located in the display area 100, but there is no part of the structure of the passivation layer 140 in the package area 203, depending on the requirements. In some embodiments, the planarization layer may also be a single layer structure; or after the first planarization layer 107 and the second planarization layer 16 are patterned, the planarization layer may include the first planarization film layer and the second planarization film layer located in the display area 100, and the package area 203 and the wiring area 202 may only have a structure after patterning the first planarization layer, but not have a structure after patterning the second planarization layer, depending on the specific requirements.

As shown in FIG. 7, the transfer line 170 may be electrically connected with the signal line 130 located in the wiring area 202 through a via hole, specifically, the transfer line 170 may contact with the signal line 130 below the first packaging dam 7 and at a side of the second packaging dam 8 away from the first packaging dam 7 to realize electrical connection, which it is not limited thereto. The first conductive layer 22 may be electrically connected with the transfer line 170 located in the wiring area 202 through a via hole, specifically, the first conductive layer 22 may contact with the transfer line 170 below the first packaging dam 7 to realize electrical connection, which is not limited thereto. The first conductive layer 22 may also be electrically connected with the second conductive layer 52 located in the wiring area 202. This signal line 130 may be a VSS power line, or the like, which is not limited thereto.

In some embodiments, the wiring area 202 may be provided with not only the signal line 130, the first conductive layer 22, the transfer line 170, but also other wirings (not shown). It should be understood that other wirings may include not only wirings disposed on the same layer as the source electrode 108 and the drain electrode 109 and wirings disposed on the same layer as the first electrode, but also wirings disposed on the same layer as the first electrode plate 110a, the second electrode plate 110b, the transfer electrode 150, or the like.

The relationship among the peripheral drive circuit, the insulating strip 32 and the first conductive layer 22 will be described below.

Figure 12A:
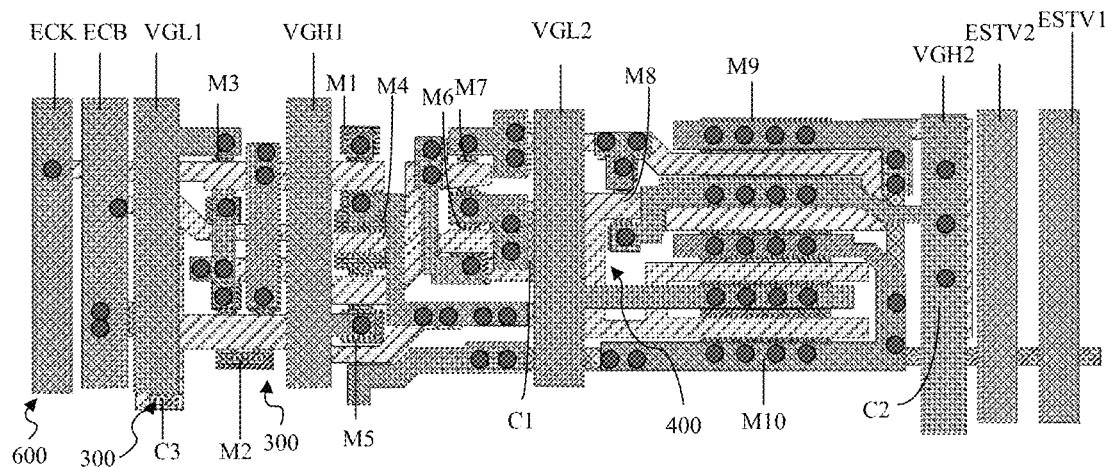
FIGS. 12A-12E are schematic views of layers of a light emitting control circuit in an embodiment of a display panel of the present disclosure.
Figure 12B:
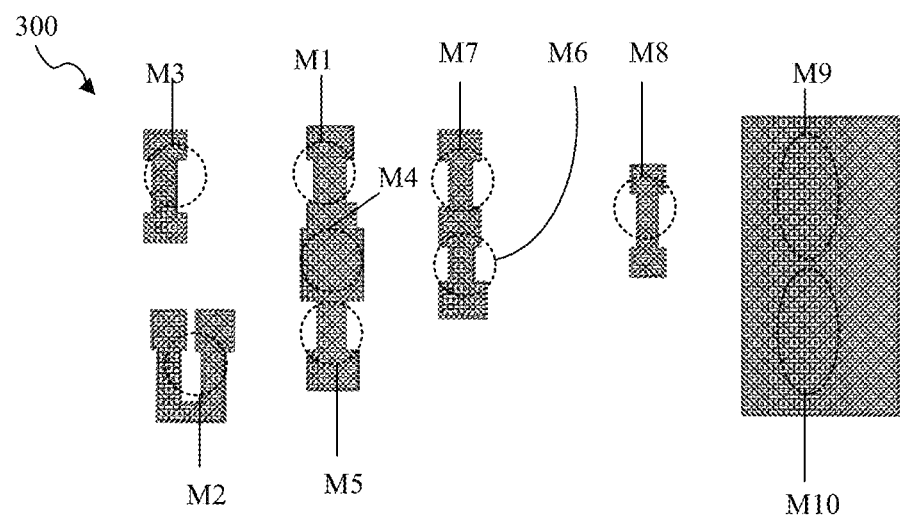
Figure 12C:
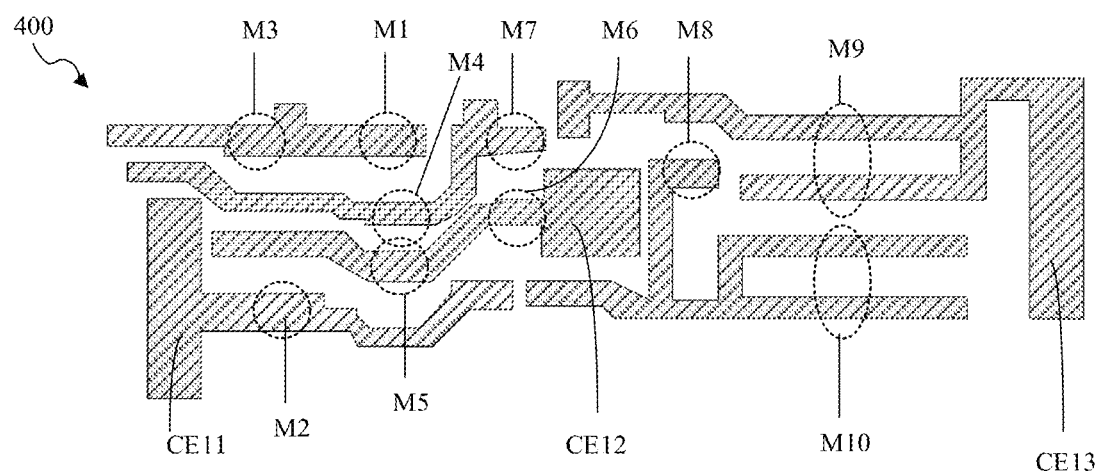
Figure 12D:
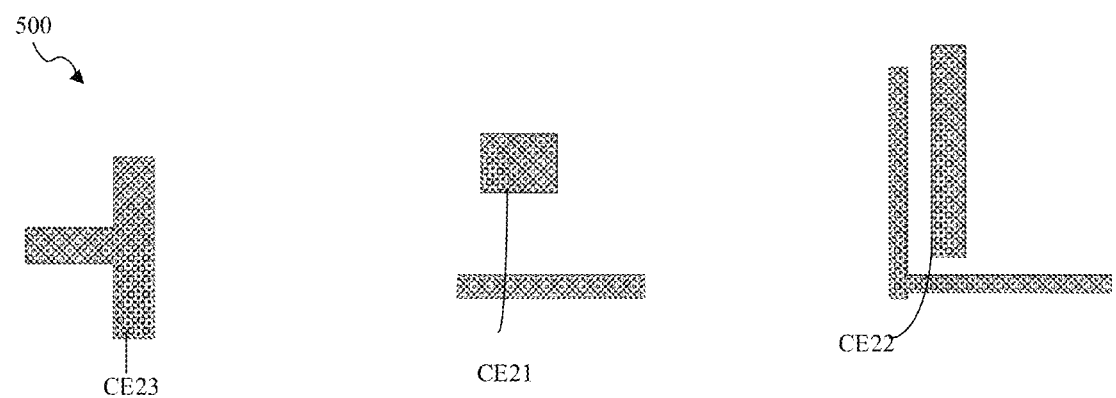
Figure 12E:
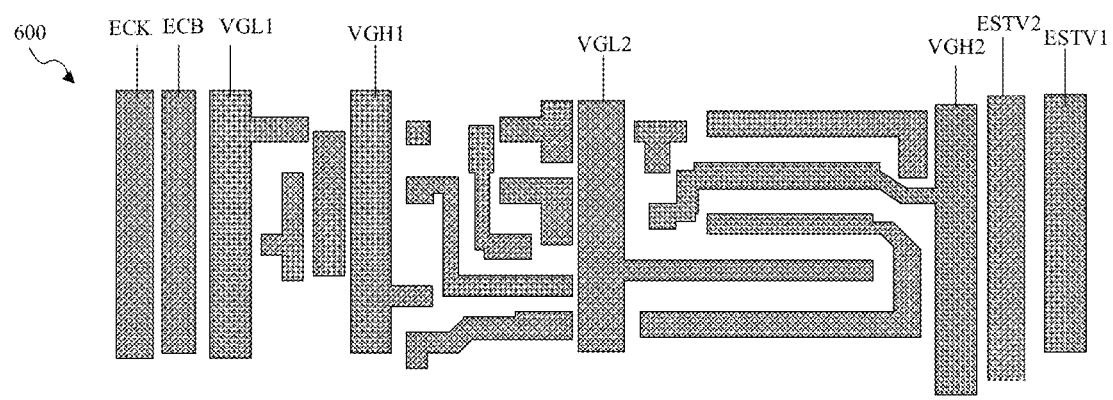
Figure 13:
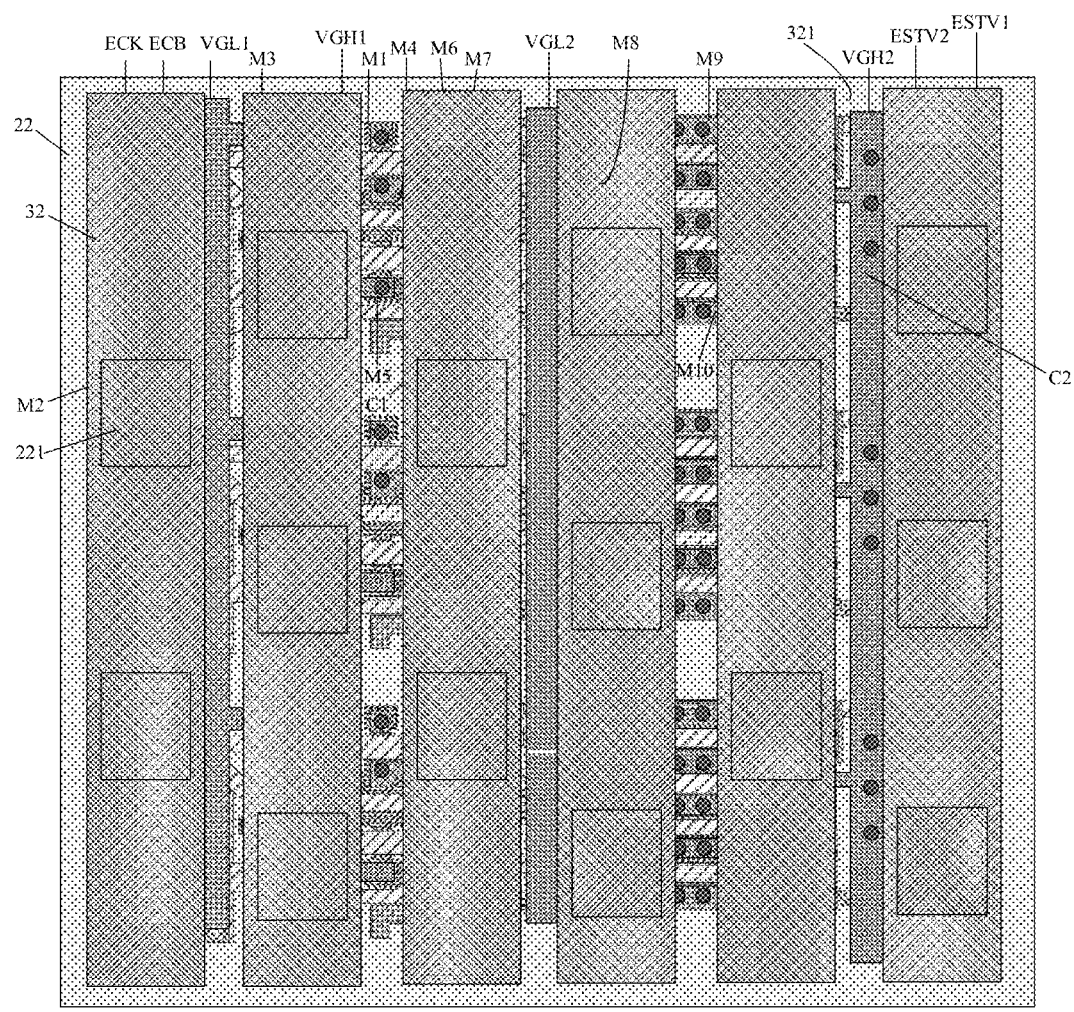
FIG. 13 is a top view of insulating strips, a first conductive layer and a light emitting control circuit of an embodiment of a display panel of the present disclosure.

As shown in FIGS. 1, 12A and 13, in some embodiments of the present disclosure, the peripheral drive circuit may include a light emitting control circuit EMGOA, and a plurality of insulating strips 32 at least partially overlap with the orthographic projection of the light emitting control circuit EMGOA on the drive back plate 1. Further, orthographic projections of the first conductive layer 22 and the light emitting control circuit on the plane where the drive back plate 1 is located at least partially overlap, and are insulated from each other.

The light emitting control circuit includes at least one light emitting control circuit signal line, and the orthographic projections of the at least one light emitting control circuit signal line and at least one insulating strip 32 on the drive back plate 1 at least partially overlap. The orthographic projections of the at least one light emitting control circuit signal line and at least one through hole 221 on the drive back plate 1 at least partially overlap.

In some embodiments of the present disclosure, at least one light emitting control circuit signal line includes a clock signal line; the clock signal line includes a first clock signal line (ECK) and a second clock signal line (ECB) that are adjacent to each other, and the second clock signal line has a signal contrary to that of the first clock signal line. The orthographic projection of at least one insulating strip 32 on the drive back plate 1 at least partially overlaps with the orthographic projection of the first clock signal line and the second clock signal line on the drive back plate. Further, the orthographic projection of at least one row of through holes 221 covered by the same insulating strip 32 on the drive back plate 1 at least partially overlaps with the orthographic projections of the first clock signal line and the second clock signal line on the drive back plate 1.

In some embodiments of the present disclosure, at least one light emitting control circuit signal line further includes a power signal line, and the light emitting control circuit further includes at least one switch unit. The power signal line includes a first power signal line (VGL1, VGL2) and a second power signal line (VGH1, VGH2) having a signal contrary to (substantially parallel to) that of the first power signal line. The switch unit is located between the first power signal line and the second power signal line, and one of the first power signal line and the second power signal line is adjacent to the clock signal line. Meanwhile, the orthographic projection of at least one of the first power signal line and the second power signal line on the drive back plate 1 at least partially overlaps with the orthographic projection of at least one insulating strip 32 on the drive back plate 1, for example, the orthographic projections of the first power signal line and the second power signal line on the drive back plate 1 at least partially overlap with different insulating strips 32.

Further, the orthographic projection of at least one of the first power signal line and the second power signal line on the drive back plate at least partially overlaps with the orthographic projection of at least one through hole 221 on the drive back plate 1. For example, the orthographic projection of at least one of the first power signal line and the second power signal line on the drive back plate 1 at least partially overlaps with a row of through holes 32.

Further, at least part of the structure of at least one of the above-mentioned switch units at least partially overlaps with the orthography projection of at least one insulating strip 32 on the drive back plate 1. In addition, at least part of the structure of the switch unit at least partially overlaps with the orthographic projection of at least one through hole 221 on the drive back plate 1.

In some embodiments of the present disclosure, at least one of the above-mentioned light emitting control circuit signal lines further includes a starting signal line which includes a first starting signal line (ESTV1, ESTV2) and a second starting signal line adjacent to each other. The orthographic projection of at least one insulating strip 32 on the drive back plate 1 at least partially overlaps with the orthographic projection of each of the first starting signal line and the second starting signal line on the drive back plate 1.

Further, the orthographic projection of at least one row of through holes 221 covered by the same insulating strip 32 on the drive back plate 1 at least partially overlaps with the orthographic projection of each of the first starting signal line and the second starting signal line on the drive back plate 1.

Figure 10:
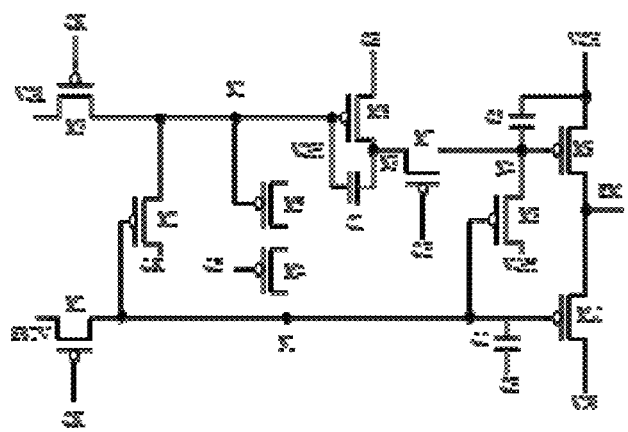
FIG. 10 is an equivalent circuit diagram of a light emitting control circuit in an embodiment of a display panel of the present disclosure.

Taking the light emitting control circuit EMGOA shown in FIG. 10 as an example, first to tenth transistors M1 to M10 and first to third capacitors C1 to C3 are included, and each of transistors has a control terminal, a first terminal and a second terminal.

The control terminal of the first transistor M1 is used to input a first clock signal CK, the first terminal of the first transistor M1 is used to input a starting signal ESTV, and the second terminal of the first transistor M1 is connected with the control terminal of the second transistor M2, the first terminal of the second transistor M2 is used to input a first clock signal CK, the second terminal of the second transistor M2 is connected with the second terminal of the third transistor M3, the first terminal of the third transistor M3 is used to input a fourth voltage VGL, the control terminal of the third transistor M3 is used to input a first clock signal CK.

The control terminal of the fourth transistor M4 is used to input a second clock signal CB, the first terminal of the fourth transistor M4, the second terminal of the first transistor M1 and the control terminal of the tenth transistor M10 are connected to a first node N1. The second terminal of the fourth transistor M4 is connected with the first terminal of the fifth transistor M5. The control terminal of the fifth transistor M5, the second terminal of the second transistor M3 and the control terminal of the sixth transistor M6 are connected to a second node N2. The second terminal of the fifth transistor M5 is used to input a third voltage VGH. The control terminal of the sixth transistor M6 is connected to a third node N3 through a first capacitor C1 and the first terminal of the sixth transistor M6, and the second terminal of the sixth transistor M6 is used to input a second clock signal CB.

The control terminal of the seventh transistor M7 is used to input a second clock signal CB. The first terminal of the seventh transistor M7 is connected to a third node N3. The second terminal of the seventh transistor M7, the second terminal of the eighth transistor M8 and the control terminal of the ninth transistor M9 are connected to a fourth node N4. The fourth node N4 is connected to the second terminal of the ninth transistor M9 through a third capacitor C3. The second terminal of the ninth transistor M9 is used to input a third voltage VGH.

The control terminal of the eighth transistor M8 is connected with the first node N1 and the control terminal of the tenth transistor M10. The first terminal of the tenth transistor M10 is used to input a fourth voltage VGL. The second capacitor C2 has one end connected with the control terminal of the tenth transistor M10, and the other end used to input a second clock signal CB. The second terminal of the tenth transistor M10 is connected with the first terminal of the ninth transistor M9 and is used to output a light emitting control signal EM.

Figure 11:
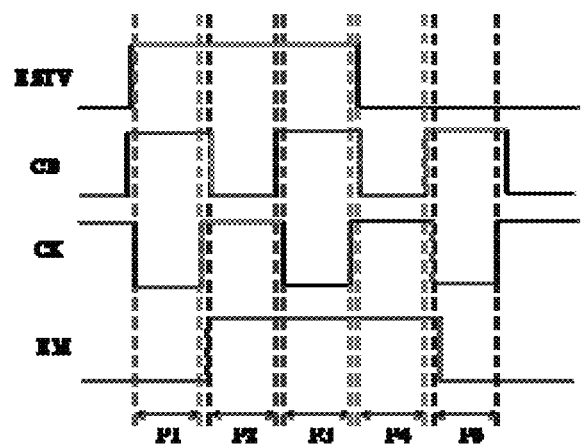
FIG. 11 is a timing chart of an operation of a light emitting control circuit in an embodiment of a display panel of the present disclosure.

The principle of the light emitting control circuit EMGOA will be described below with reference to FIG. 10 and FIG. 11.

In a first stage P1, as the first clock signal CK is at a low level, the first transistor M1 and the third transistor M3 are conducted, and the conducted first transistor M1 transmits a high-level starting signal ESTV to the first node N1, so that the level of the first node N1 becomes a high level, and the second transistor M2, the eighth transistor M8 and the tenth transistor M10 are cut off; in addition, the conducted third transistor M3 transmits the low-level fourth voltage VGL to the second node N2, so that the level of the second node N2 becomes a low level, and the fifth transistor M5 and the sixth transistor M6 are conducted. Since the second clock signal CB is at a high level, the seventh transistor M7 is cut off. In addition, due to the storage effect of the third capacitor C3, the level of the fourth node N4 may retain a high level, so that the ninth transistor M9 is cut off. In the first stage P1, since both the ninth transistor M9 and the tenth transistor M10 are cut off, the light emitting control signal EM output by the light emitting control circuit EMGOA retains the previous low level.

In a second stage P2, as the second clock signal CB is at a low level, the fourth transistor M4 and the seventh transistor M7 are conducted. The first transistor M1 and the third transistor M3 are cut off since the first clock signal CK is at a high level. Due to the storage effect of the first capacitor C1, the second node N2 may continue to retain the low level of the previous stage, so that the fifth transistor M5 and the sixth transistor M6 are conducted. The high-level third voltage VGH is transmitted to the first node N1 through the conducted fifth transistor M5 and fourth transistor M4, so that the level of the first node N1 continues to retain the high level of the previous stage, so that the second transistor M2, the eighth transistor M8 and the tenth transistor M10 are cut off. In addition, the low-level second clock signal CB is transmitted to the fourth node N4 through the conducted sixth transistor M6 and seventh transistor M7, so that the level of the fourth node N4 becomes a low level, and the ninth transistor M9 is conducted, the conducted ninth transistor M9 outputs the high-level third voltage VGH, and the light emitting control signal EM output by the light emitting control circuit EMGOA in the second stage P2 is at a high level.

In a third stage P3, as the first clock signal CK is at a low level, the first transistor M1 and the third transistor M3 are conducted. Since the second clock signal CB is at a high level, the fourth transistor M4 and the seventh transistor M7 are cut off. Due to the storage effect of the third capacitor C3, the level of the fourth node N4 may retain the low level of the previous stage, so that the ninth transistor M9 retains to be conducted, the conducted ninth transistor M9 outputs the high-level third voltage VGH, and thus the light emitting control signal EM output by the light emitting control circuit EMGOA in the third stage P3 is still at the high level.

In a fourth stage P4, as the first clock signal CK is at a high level, the first transistor M1 and the third transistor M3 are cut off. Since the second clock signal CB is at a low level, the fourth transistor M4 and the seventh transistor M7 are conducted. Due to the storage effect of the second capacitor C2, the level of the first node N1 retains the high level of the previous stage, so that the second transistor M2, the eighth transistor M8 and the tenth transistor M10 are cut off. Due to the storage effect of the first capacitor C1, the second node N2 continues to retain the low level of the previous stage, so that the fifth transistor M5 and the sixth transistor M6 are conducted. In addition, the low-level second clock signal CB is transmitted to the fourth node N4 through the conducted sixth transistor M6 and seventh transistor M7, so that the level of the fourth node N4 becomes a low level, the ninth transistor M9 is conducted, the conducted ninth transistor M9 outputs the high-level third voltage VGH, and thus the light emitting control signal EM output by the light emitting control circuit EMGOA in the second stage P2 is still at the high level.

In a fifth stage P5, as the first clock signal CK is at a low level, the first transistor M1 and the third transistor M3 are conducted. Since the second clock signal CB is at a high level, the fourth transistor M4 and the seventh transistor M7 are cut off. The conducted first transistor M1 transmits the low-level starting signal ESTV to the first node N1, so that the level of the first node N1 becomes a low level, and the second transistor M2, the eighth transistor M8, and the tenth transistor M10 are conducted. The conducted second transistor M2 transmits the low-level first clock signal CK to the second node N2, so that the level of the second node N2 may be further lowered, the second node N2 continues to retain the low level of the previous stage, so as to conduct the fifth transistor M5 and the sixth transistor M6. In addition, the conducted eighth transistor M8 transmits the high-level third voltage VGH to the fourth node N4, so that the level of the fourth node N4 becomes a high level, and thus the ninth transistor M9 is cut off. The conducted tenth transistor M10 outputs the low-level fourth voltage VGL, so that the light emitting control signal EM output by the light emitting control circuit EMGOA in the fifth stage P5 becomes a low level.

As shown in FIGS. 12A-12E, FIG. 12A shows a top view of the light emitting control circuit EMGOA. The light emitting control circuit EMGOA includes a semiconductor layer 300, a gate metal layer 400, a capacitor electrode plate layer 500 and a source-drain metal layer 600 distributed from the base 101 to the first electrode layer 2, wherein in the first transistor M1 to the tenth transistor M10, the active layers are all located in the semiconductor layer 300, and gate electrodes, a first electrode plate CE11 of the first capacitor C1, a second electrode plate CE12 of the second capacitor C2 and a first electrode plate CE13 of the third capacitor C3 are all located in the gate metal layer 400; a second electrode plate CE21 of the first capacitor C1, a second electrode plate CE22 of the second capacitor C2 and a second electrode plate CE23 of the third capacitor C3 are all located in the capacitor electrode plate layer 500, and source electrodes and drain electrodes of the transistors (M1-M10) are all located in the source-drain metal layer 600. Further, the source-drain metal layer 500 may further include a first signal line ECK, a second signal line ECB, a third signal line VGH1, a fourth signal line VGH2, a fifth signal line VGL1, a sixth signal line VGL2, a seventh signal line ESTV1, and an eighth signal line ESTV2.

The first signal line ECK is a first clock signal line for transmitting the first clock signal CK.

The second signal line ECB is a second clock signal line for transmitting the second clock signal CB.

The third signal line VGH1 and the fourth signal line VGH2 are used to transmit a third voltage VGH. The third signal line VGH1 and the fourth signal line VGH2 are second power signal lines.

The fifth signal line VGL1 and the sixth signal line VGL2 are used to transmit a fourth voltage VGL. The fifth signal line VGL1 and the sixth signal line VGL2 are first power signal lines.

The seventh signal line ESTV1 is a first starting signal line, and the eighth signal line ESTV2 is a second starting signal line, both of which are used to transmit a starting signal ESTV.

The switch unit may be a second transistor M2, as shown in FIGS. 3 and 6. The switch unit may be a transistor with a top gate structure, and includes a driving active layer 102a, a first gate insulating layer 103, a driving first gate electrode 104a, a second gate insulating layer 105, and a driving source-drain layer (including a driving source electrode 108a and a driving drain electrode 109a). The driving active layer 102a is disposed on the same layer as the active layer 102 of the drive transistor 700. The driving first gate electrode 104a is disposed on the same layer as the first gate electrode 104 of the drive transistor 700. The driving source electrode 108a and a driving drain electrode 109a are disposed on the same layer as the source electrode 108 and the drain electrode 109 of the drive transistor 700.

Further, the active layer 102 of the drive transistor of the display area 100 may be disposed on the same layer as the semiconductor layer 300, the first gate electrode 104 is disposed on the same layer as the gate metal layer 400, and one of the source-drain layer and the transfer electrode 150 is disposed on the same layer as the source-drain metal layer 500. Therefore, the film layers disposed on the same layer may be formed by one-time patterning process, so as to simplify the process.

Further, as shown in FIGS. 12A-12E, both the first signal line ECK and the second signal line ECB are located in the peripheral area 200 and are disposed in parallel at a side of the first conductive layer 22 close to the drive back plate 1. Since a capacitance is generated between the first signal line ECK and the second signal line ECB, there is large difference between signal strengths of the first clock signal CK and the second clock signal CB if the capacitance between the first signal line ECK and the first conductive layer 22 is different from the capacitance between the second signal line ECB and the first conductive layer. Therefore, projections of the first signal line ECK and the second signal line ECB on the drive back plate 1 may be located within the projection of the same insulating strip 32 on the drive back plate 1, thus corresponding to the same row of through holes 221 covered by this insulating strip 32. Meanwhile, the projections of the first signal line ECK and the second signal line ECB on the drive back plate 1 both run through the through hole 221, that is, a width of each of the first signal line ECK and the second signal line ECB is not larger than a width of the through hole 221 in the direction perpendicular to the extending direction of the first signal line ECK. Therefore, the capacitance generated between the first signal line ECK and the first conductive layer 22 is consistent with the capacitance between the second signal line ECB and the first conductive layer, so as to avoid a large difference in signal strength between the first clock signal CK and the second clock signal CB.

The first starting signal line ESTV1 and the second signal line ESTV2 are located in the peripheral area 200, and are disposed in parallel at a side of the first conductive layer 22 close to the drive back plate 1. Since a capacitance can be generated between the first starting signal line ESTV1 or the second signal line ESTV2 and the first conductive layer 22, there is a large difference in signal strength between the first starting signal line ESTV1 and the second signal line ESTV2 if the capacitance generated between the first starting signal line ESTV1 and the first conductive layer 22 is different from the second signal line ESTV2 and the first conductive layer. Therefore, projections of the first starting signal line ESTV1 and the second signal line ESTV2 on the drive back plate 1 may be located within the projection of the same insulating strip 32 on the drive back plate 1, thus corresponding to the same row of through holes 221 covered by this insulating strip 32. Meanwhile, the projections of the first starting signal line ESTV1 and the second signal line ESTV2 on the drive back plate 1 both run through the through hole 221, that is, a width of each of the first starting signal line ESTV1 and the second signal line ESTV2 is not larger than a width of the through hole 221 in a direction perpendicular to the extending direction of the first starting signal line ESTV1. Therefore, the capacitance generated between the first starting signal line ESTV1 and the first conductive layer 22 is consistent with the capacitance generated between the second signal line ESTV2 and the first conductive layer, to avoid the large difference in signal strength between the first starting signal line ESTV1 and the second signal line ESTV2.

As shown in FIG. 1, the peripheral area 200 of the drive back plate 1 provides various signals, such as data signals, gate signals, EM signals, Vinit signals, VDD signals, VSS signals, or the like for display to the display area 100 through the drive chip and the circuit board. The peripheral area 200 is required to have corresponding circuits and lines, and the peripheral drive circuit may also include, for example, a pixel detection circuit (Cell Test, abbreviated as CT), a data line (Data), a leading wire for data line (Data Fanout), a first power line (ELVDD), a second power line (ELVSS), an electrostatic discharge unit (ESD), an initialization signal line (Vinit), a circuit board (COP Pad), a gate drive circuit (Gate GOA), and a light emitting control circuit. The gate drive circuit, the light emitting control circuit and the pixel detection circuit are sequentially distributed along the direction facing away from the display area 100 (i.e., towards the outside of the display area 100).

The pixel detection circuit CT is used to detect whether the pixel can be lighted up or not and whether a bad spot is presented.

The leading wire for data line refers to a lead-out line of data line in the peripheral area 200, in a fan shape. The data line and the leading wire for data line change layers at a junction between the display area 100 and the peripheral area 200 through a via hole.

The first power line (ELVDD) is used to provide a positive voltage for the pixel circuit.

The second power line is connected to the second conductive layer 52 in the peripheral area 200, so as to connect with the second electrode 51. The second power line may include a first layer ELVSS1 (i.e., the signal line 130 disposed on the same layer as the source-drain layer as shown in FIG. 7) and a second layer ELVSS2 (i.e., the transfer line 170 disposed on the same layer as the transfer electrode 150 of the display area 100, as shown in FIG. 7).

An electrostatic discharge unit is used to remove static electricity generated in the manufacturing process and prevent the drive back plate 1 from being damaged, and the electrostatic discharge unit may be disposed at several positions in the peripheral area 200.

The light emitting control circuit is at a side of the gate drive circuit away from the display area 100.

The gate drive circuit is used to control the gate electrode of the drive transistor of the display area 100 through the gate line to turn the drive transistor on or off. The light emitting control circuit is used to control the light emitting unit of the display area 100 to emit light through the light emitting control line.

The first conductive layer 22 and the insulating layer 32 in the embodiment of the present application are disposed at a side of the light emitting control circuit facing away from the driving substrate 1.

The first conductive layer 22 and the insulating layer 32 are disposed at a side of at least one of the light emitting control circuit and the gate drive circuit facing away from the driving substrate 1.

The pixel circuit in the display area 100 will be described in detail below.

Figure 14:
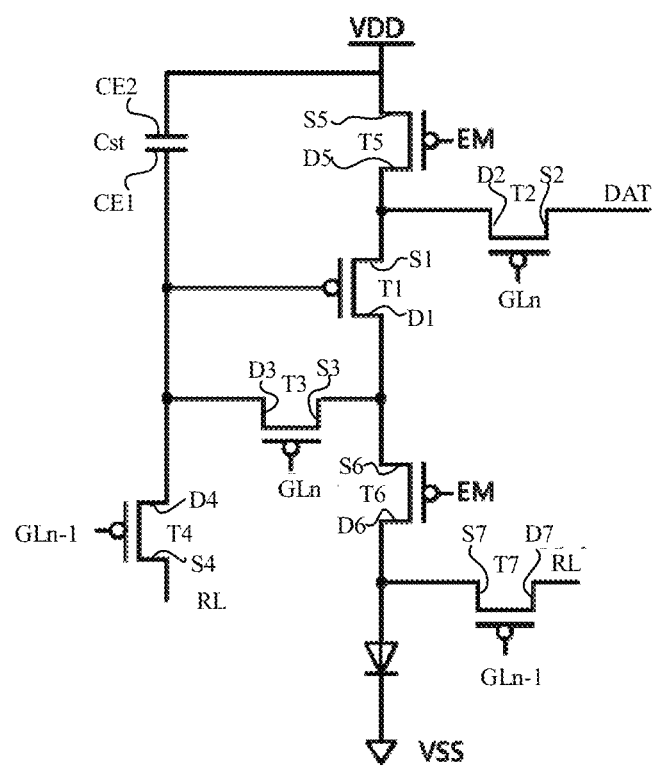
FIG. 14 is an equivalent circuit diagram of a pixel circuit in an embodiment of a display panel of the present disclosure.

FIG. 14 is an equivalent circuit diagram of a pixel circuit provided by at least one embodiment of the present disclosure, and FIGS. 15A-15E are schematic views of layers of the pixel circuit provided by some embodiments of the present disclosure.

In some embodiments, as shown in FIG. 14, the pixel circuit includes a plurality of thin film transistors T1, T2, T3, T4, T5, T6, and T7, a plurality of signal lines connected to the thin film transistors T1, T2, T3, T4, T5, T6, and T7, and a storage capacitor Cst, wherein a plurality of signal lines include a gate line GL (i.e., a scanning signal line), a light emitting control line EM, an initialization line RL, a data line DAT and a first power line VDD. The gate line GL may include a first gate line GLn and a second gate line GLn−1, for example, the first gate line GLn may be used to transmit a gate scanning signal, and the second gate line GLn−1 may be used to transmit a reset signal. The light emitting control line EM may be used to transmit a light emitting control signal. Therefore, the pixel circuit is a pixel circuit of the 7T1C.

It should be noted that the embodiments of the present disclosure include, but not limited to the above situations, and the pixel circuit may also adopt other types of circuit structures, such as a 7T2C structure or a 9T2C structure, which is not limited by the embodiments of the present disclosure.

For example, as shown in FIG. 14, a first gate electrode G1 of a first thin film transistor T1 is electrically connected with a third drain electrode D3 of a third thin film transistor T3 and a fourth drain electrode D4 of a fourth thin film transistor T4. A first source electrode S1 of the first thin film transistor T1 is electrically connected with a second drain electrode D2 of the second thin film transistor T2 and a fifth drain electrode D5 of the fifth thin film transistor T5. A first drain electrode D1 of the first thin film transistor T1 is electrically connected with a third source electrode S3 of the third thin film transistor T3 and a sixth source electrode S6 of the sixth thin film transistor T6.

For example, as shown in FIG. 14, a second gate electrode G2 of the second thin film transistor T2 is electrically connected with the first gate line GLn to receive a gate scanning signal, a second source electrode S2 of the second thin film transistor T2 is electrically connected with the data line DAT to receive a data signal, and a second drain electrode D2 of the second thin film transistor T2 is electrically connected with the first source electrode S1 of the first thin film transistor T1.

For example, as shown in FIG. 14, a third gate electrode G3 of the third thin film transistor T3 is electrically connected to the first gate line GLn, a third source electrode S3 of the third thin film transistor T3 is electrically connected to the first drain electrode D1 of the first thin film transistor T1, and a third drain electrode D3 of the third thin film transistor T3 is electrically connected to the first gate electrode G1 of the first thin film transistor T1.

For example, as shown in FIG. 14, a fourth gate electrode G4 of the fourth thin film transistor T4 is configured to be electrically connected with the second gate line GLn-1 to receive a reset signal, a fourth source electrode S4 of the fourth thin film transistor T4 is configured to be electrically connected with the initialization line RL to receive an initialization signal, and a fourth drain electrode D4 of the fourth thin film transistor T4 is electrically connected with the first gate electrode G1 of the first thin film transistor T1.

For example, as shown in FIG. 14, a fifth gate electrode G5 of the fifth thin film transistor T5 is configured to be electrically connected with the light emitting control line EM to receive a light emitting control signal, a fifth source electrode S5 of the fifth thin film transistor T5 is configured to be electrically connected with the first power line VDD to receive a first power signal, and a fifth drain electrode D5 of the fifth thin film transistor T5 is electrically connected with the first source electrode S1 of the first thin film transistor T1.

For example, as shown in FIG. 14, the sixth thin film transistor T6 may be the aforementioned drive transistor, the sixth gate electrode G6 of which is configured to be electrically connected with the light emitting control line EM to receive a light emitting control signal, the sixth source electrode S6 of which is electrically connected to the first drain electrode D1 of the first thin film transistor T1, and the sixth drain electrode D6 of which is electrically connected to the first display electrode (for example, the first electrode 21) of the light emitting element 180.

For example, as shown in FIG. 14, a seventh gate electrode G7 of the seventh thin film transistor T7 is configured to be electrically connected with the second gate line GLn-1 to receive a reset signal, a seventh source electrode S7 of the seventh thin film transistor T7 is electrically connected with the first display electrode (e.g., the first electrode 21) of the light emitting element 180, and a seventh drain electrode D7 of the seventh thin film transistor T7 is configured to be electrically connected with the initialization line RL to receive an initialization signal. For example, the seventh drain electrode D7 of the seventh thin film transistor T7 may be electrically connected to the initialization line RL by being connected to the fourth source electrode S4 of the fourth thin film transistor T4.

For example, as shown in FIG. 14, the storage capacitor Cst includes a first capacitor electrode CE1 (i.e., a first electrode plate 110a) and a second capacitor electrode CE2 (i.e., a second electrode plate 110b). The second capacitor electrode CE2 is electrically connected to the first power line VDD, and the first capacitor electrode CE1 is electrically connected to the first gate electrode G1 of the first thin film transistor T1 and the third drain electrode D3 of the third thin film transistor T3.

For example, as shown in FIG. 14, the second display electrode (i.e., the second electrode 51) of the light emitting element 180 is electrically connected to the second power line VSS.

It should be noted that one of the first power line VDD and the second power line VSS is a power line providing a high voltage, and the other of the first power line VDD and the second power line VSS is a power line providing a low voltage. In the embodiment shown in FIG. 14, the first power line VDD provides a constant first voltage, which is a positive voltage; while the second power line VSS provides a constant second voltage, which may be a negative voltage, or the like. For example, in some examples, the second voltage may be a ground voltage.

It should be noted that the reset signal and the initialization signal may be the same signal.

It should be noted that, according to the characteristics of transistors, transistors may be divided into N-type transistors and P-type transistors. For the sake of clarity, the embodiment of this disclosure takes a P-type transistor (e.g., a P-type TFT) as an example to describe the technical solution of this disclosure, that is, in the description of this disclosure, each of the first transistor T1, the second transistor T2, the third transistor T3, the fourth transistor T4, the fifth transistor T5, the sixth transistor T6 and the seventh transistor T7 may be a P-type transistor. However, the transistors in the embodiments of the present disclosure are not limited to P-type transistors, and those skilled in the art can also use N-type transistors (e.g., N-type TFTs) to realize the functions of one or more transistors in the embodiments of the present disclosure according to actual requirements.

It should be noted that the transistors used in the embodiments of this disclosure may be thin film transistors, field effect transistors or other switching devices with the same characteristics, and the thin film transistor may include an oxide semiconductor thin film transistor, an amorphous silicon thin film transistor or a polysilicon thin film transistor, and the like. The source electrode and the drain electrode of the transistor may be symmetrical in structure, so the source electrode and the drain electrode of the transistor may not be different in physical structure. In the embodiment of the present disclosure, the source electrodes and the drain electrodes of all or some of the transistors can be interchanged as required.

Figure 15A:
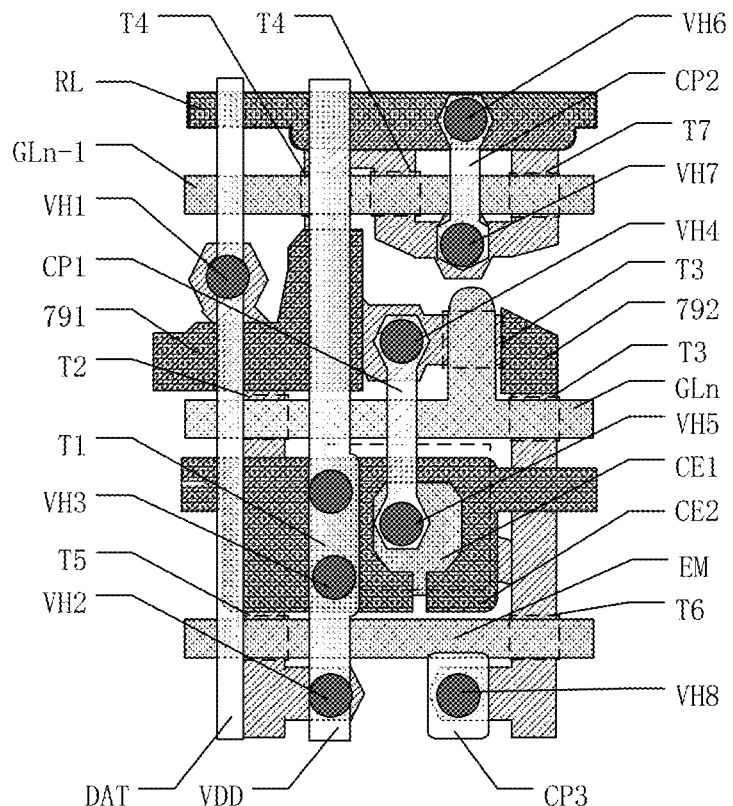
FIGS. 15A-15E are schematic views of layers of a pixel circuit in an embodiment of a display panel of the present disclosure.

In some embodiments, as shown in FIG. 15A, the pixel circuit includes the above-mentioned thin film transistors T1, T2, T3, T4, T5, T6 and T7, a storage capacitor Cst, a first gate line GLn, a second gate line GLn-1, a light emitting control line EM, an initialization line RL, a data line DAT and a first power line VDD which are connected to a plurality of thin film transistors T1, T2, T3, T4, T5, T6 and T7. The structure of the pixel circuit will be described with reference to FIGS. 5, 14 and 15A-15E below.

For example, FIG. 15A is a schematic view of the laminated positional relationship among a semiconductor layer, a first conductor layer, a second conductor layer and a third conductor layer of the pixel circuit.

Figure 15B:
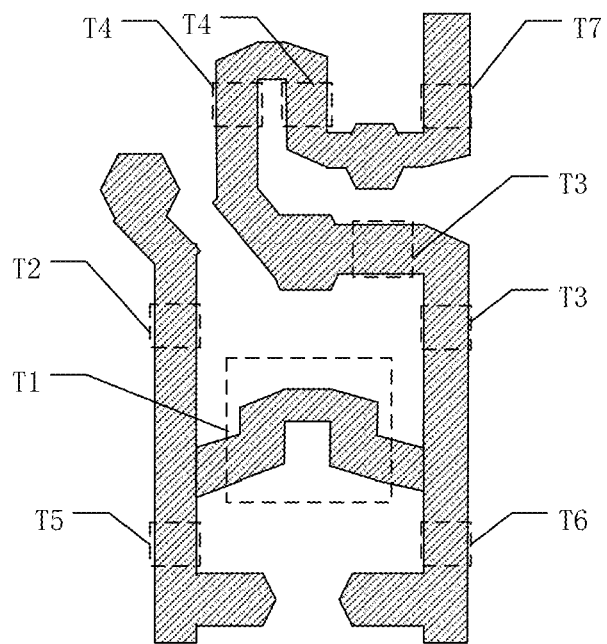

FIG. 15B shows a semiconductor layer of a pixel circuit. The semiconductor layer includes an active layer, for example, the active layer of the sixth thin film transistor T6. The semiconductor layer may be formed by a patterning process using a semiconductor material layer. The semiconductor layer may be used to manufacture the active layers of the first thin film transistor T1, the second thin film transistor T2, the third thin film transistor T3, the fourth thin film transistor T4, the fifth thin film transistor T5, the sixth thin film transistor T6 and the seventh thin film transistor T7, and each active layer may include a source area, a drain area and a channel area between the source area and the drain area. For example, the semiconductor layer may be made of amorphous silicon, polysilicon, oxide semiconductor material, or the like. It should be noted that the source area and the drain area may be areas doped with N-type impurities or P-type impurities.

Figure 15C:
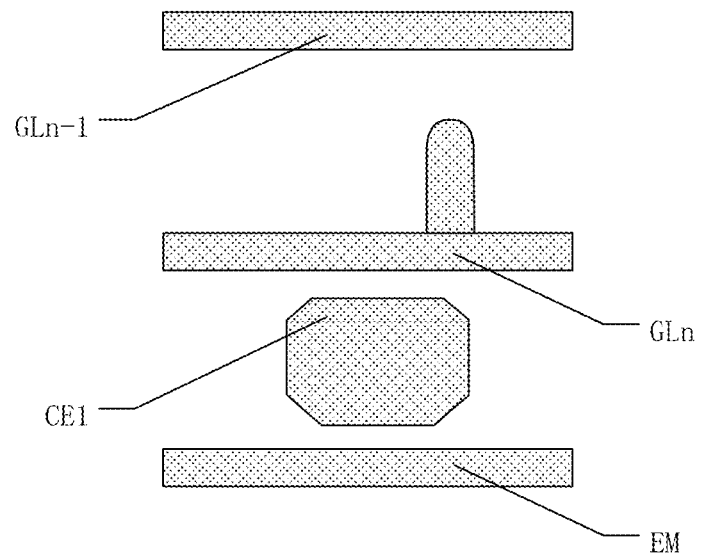

FIG. 15C shows the first conductor layer of the pixel circuit. For example, as shown in FIG. 15C, the first conductor layer of the pixel circuit is disposed on the insulating layer, thereby being insulated from the semiconductor layer shown in FIG. 15B. The first conductor layer may include a first capacitor electrode CE1 of the storage capacitor Cst, a first gate line GLn, a second gate line GLn-1, a light emitting control line EM, and gate electrodes (for example, the first gate electrode G1, the second gate electrode G2, the third gate electrode G3, the fourth gate electrode G4, the fifth gate electrode G5, the sixth gate electrode G6, the seventh gate electrode G7 mentioned above) of the first, second, third, fourth, fifth, sixth and seventh thin film transistors T1, T2, T3, T4, T5, T6 and T7. As shown in FIG. 15C, the gate electrodes of the second, fourth, fifth, sixth and seventh thin film transistors T2, T4, T5, T6 and T7 are parts where the first gate line GLn, the second gate line GLn-1, the light emitting control line EM overlap with the semiconductor layer. The third thin film transistor T3 may be a thin film transistor with a double-gate structure, a gate electrode of the third thin film transistor T3 may be a part where the first gate line GLn overlaps with the semiconductor layer, and the other gate electrode of the third thin film transistor T3 may be a protrusion protruding from the first gate line GLn. The gate electrode of the first thin film transistor T1 may be a first capacitor electrode CE1. The fourth thin film transistor T4 may be a thin film transistor with a double-gate structure, and two gate electrodes are parts where the second gate line GLn-1 overlaps with the semiconductor layer.

Figure 15D:
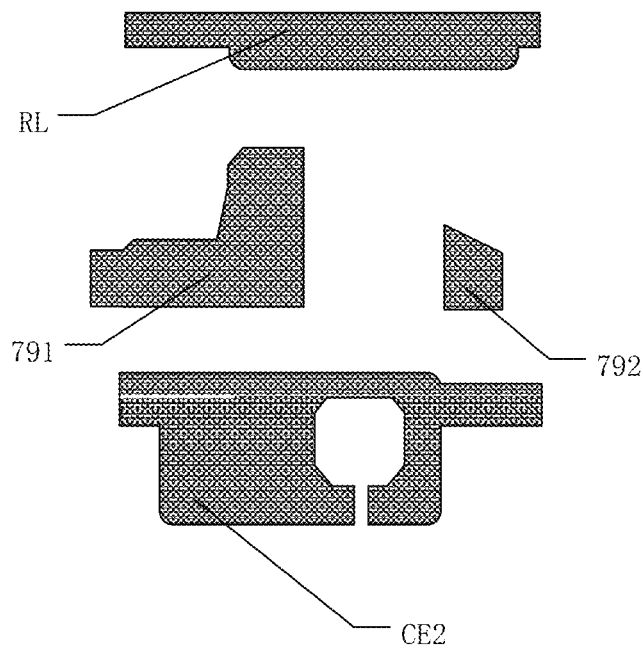

FIG. 15D shows the second conductor layer of the pixel circuit. For example, as shown in FIG. 15D, the second conductor layer of the pixel circuit includes a second capacitor electrode CE2 of the storage capacitor Cst and an initialization line RL. The second capacitor electrode CE2 at least partially overlaps with the first capacitor electrode CE1 to form the storage capacitor Cst.

For example, the second capacitor electrode CE2 shown in FIG. 15D has a notch, and in some embodiments, the second capacitor electrode CE2 may not have the notch. The embodiment of the present disclosure does not limit the specific structure of the second capacitor electrode CE2.

In some embodiments of the present disclosure, the second conductor layer may further include a first light shielding portion 791 and a second light shielding portion 792. The orthographic projection of the first light shielding portion 791 on the base substrate covers the active layer of the second thin film transistor T2, and the active layer between the drain electrode of the third thin film transistor T3 and the drain electrode of the fourth thin film transistor T4, so as to prevent external light from affecting the active layers of the second thin film transistor T2, the third thin film transistor T3 and the fourth thin film transistor T4. The orthographic projection of the second light shielding portion 792 on the base substrate covers the active layer between two gate electrodes of the third thin film transistor T3, so as to prevent external light from affecting the active layer of the third thin film transistor T3. The first light shielding portion 791 and the second light shielding portion 792 of the adjacent pixel circuit are integrally formed, and electrically connected with the first power line VDD through a via hole penetrating through the insulating layer.

Figure 15E:
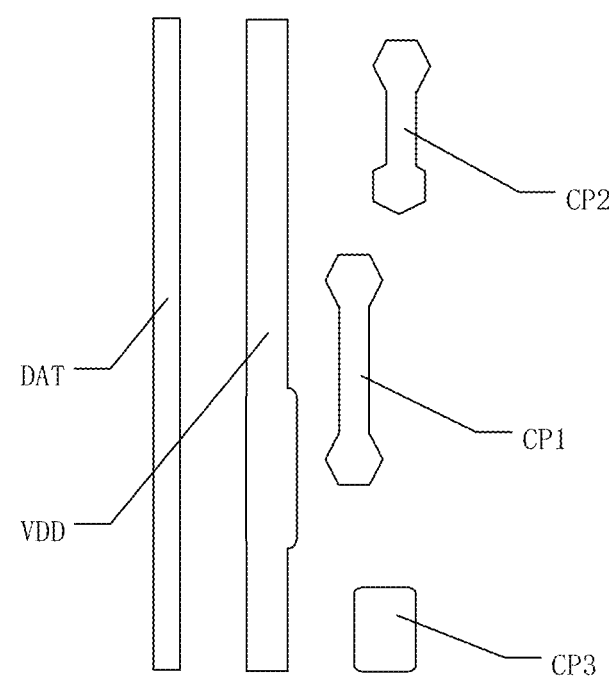

FIG. 15E shows the third conductor layer of the pixel circuit. For example, as shown in FIG. 15E, the third conductor layer of the pixel circuit includes a data line DAT and a first power line VDD. As shown in FIGS. 15A and 15E, the data line DAT is connected to the source area of the second thin film transistor T2 in the semiconductor layer through at least one via hole (e.g., the via hole VH1) in the first gate insulating layer, the second gate insulating layer and the interlayer insulating layer. The first power line VDD is connected to the source area corresponding to the fifth thin film transistor T5 in the semiconductor layer through at least one via hole (e.g., the via hole VH2) in the first gate insulating layer, the second gate insulating layer and the interlayer insulating layer. The first power line VDD is connected to the second capacitor electrode CE2 in the second conductor layer through at least one via hole (e.g., the via hole VH3) in the interlayer insulating layer.

For example, the third conductor layer further includes a first connecting portion CP1, a second connecting portion CP2, and a third connecting portion CP3. One end of the first connecting portion CP1 is connected to the drain area corresponding to the third thin film transistor T3 in the semiconductor layer through at least one via hole (e.g., the via hole VH4) in the first gate insulating layer, the second gate insulating layer and interlayer insulating layer, and the other end of the first connecting portion CP1 is connected to the gate electrode of the first thin film transistor T1 in the first conductor layer through at least one via hole (e.g., the via hole VH5) in the second gate insulating layer and interlayer insulating layer. One end of the second connecting portion CP2 is connected to the initialization line RL through one via hole (e.g., the via hole VH6) in the interlayer insulating layer, and the other end of the second connecting portion CP2 is connected to the source area of the seventh thin film transistor T7 and the source area of the fourth thin film transistor T4 in the semiconductor layer through at least one via hole (e.g., the via hole VH7) in the first gate insulating layer, the second gate insulating layer and the interlayer insulating layer. The third connecting portion CP3 is connected to the drain area of the sixth thin film transistor T6 in the semiconductor layer through at least one via hole (e.g., the via hole VH8) in the first gate insulating layer, the second gate insulating layer and the interlayer insulating layer.

Figure 15F:
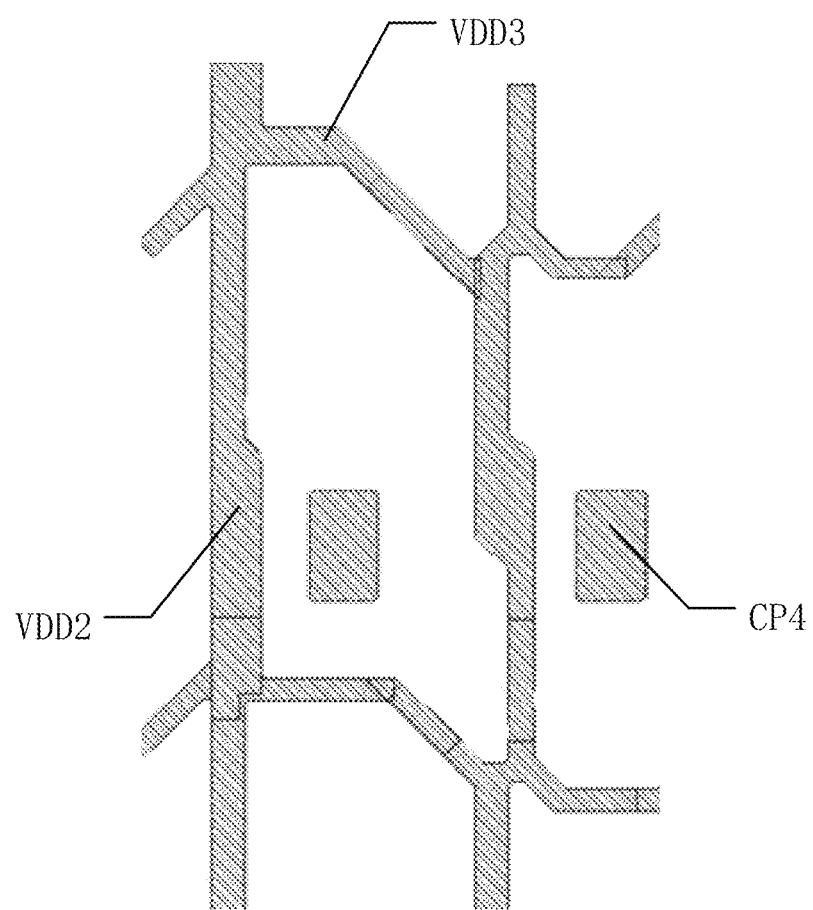
FIG. 15F is a schematic view of a conductor layer of a pixel circuit in an embodiment of a display panel of the present disclosure.

For example, in some embodiments, the pixel circuit of the display panel may further have a fourth conductor layer. For example, FIG. 15F shows the fourth conductor layer of the pixel circuit. As shown in FIG. 15F, the fourth conductor layer includes a second power line VDD2 extending in the vertical direction as shown and a third power line VDD3 intersecting with the second power line VDD2. For example, the second power line VDD2 and the third power line VDD3 are electrically connected to each other or formed as an integrated structure.

For example, in some embodiments, the second power line VDD2 and the third power line VDD3 are electrically connected with the first power line VDD through via holes, respectively, to form a mesh power line structure. This structure facilitates reducing the resistance on the power line, thus reducing the voltage drop of the power line, and facilitates uniformly transmitting the power voltage to each of sub-pixels of the display panel.

For example, in some embodiments, the fourth conductor layer further includes a fourth connecting portion CP4 insulated from the second power line VDD2 and the third power line VDD3, and the fourth connecting electrode 234 is used to electrically connect the drain electrode D6 of the sixth transistor T6 with the light emitting element 180.

Figure 16A:
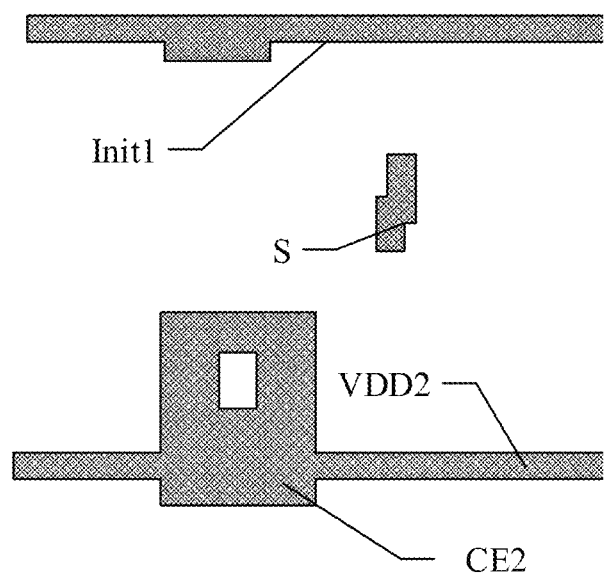
FIG. 16A is another schematic view of a second conductor layer of a pixel circuit in an embodiment of a display panel of the present disclosure.

For example, in some embodiments, other layouts of the conductive layers can also be used. For example, FIG. 16A shows a schematic plan view of another second conductor layer. As shown in FIG. 16A, in this example, the second conductor layer includes a second capacitor electrode CE2 of the storage capacitor Cst, a reset signal line Init1, a second power signal line VDD2, and a light shielding portion S. The second power signal line VDD2 and the second capacitor electrode CE2 are integrally formed.

Figure 16B:
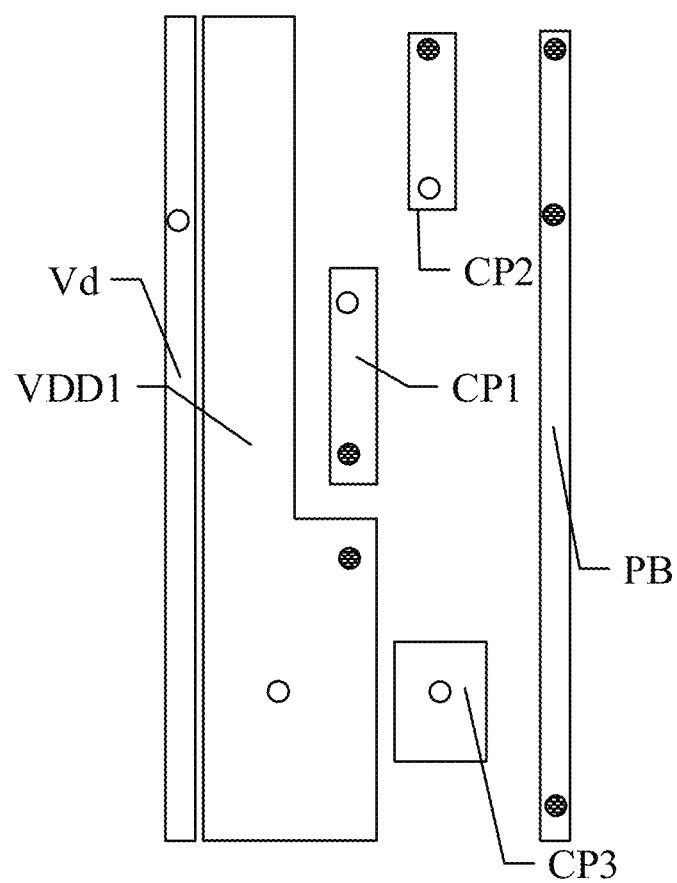
FIG. 16B is another schematic view of a third conductor layer of a pixel circuit in an embodiment of a display panel of the present disclosure.

For example, FIG. 16B shows a schematic plan view of another third conductor layer. As shown in FIG. 16B, the third conductor layer includes a data line Vd, a first power signal line VDD1, and a shield line PB. The above data line Vd, the first power signal line VDD1 and the shield line PB all extend in the same direction, such as the vertical direction as shown. For example, the third conductor layer may further include a first connecting portion CP1, a second connecting portion CP2 and a third connecting portion CP3 for electrically connecting different wirings or electrodes.

Figure 16C:
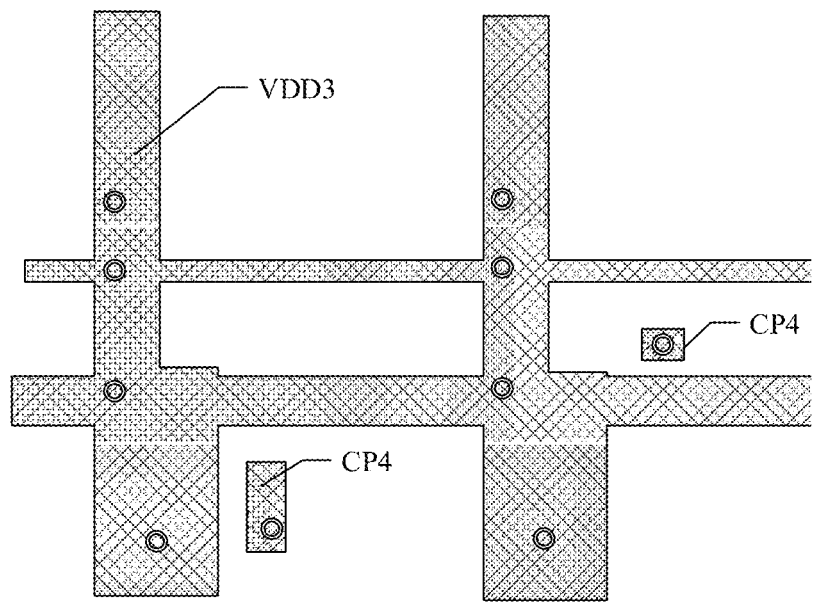
FIG. 16C is another schematic view of a fourth conductor layer of a pixel circuit in an embodiment of a display panel of the present disclosure.

For example, FIG. 16C shows a schematic plan view of another fourth conductor layer. As shown in FIG. 16C, the fourth conductor layer includes a fourth connecting portion CP4 and third power signal lines VDD3 cross-distributed along the vertical and horizontal directions in the figure. For example, in some examples, the third power signal line VDD3 may be connected in parallel with the first power signal line VDD1, to form a mesh power structure, which is beneficial to reduce the resistance of the power signal line.

Embodiments of the present disclosure provide a manufacturing method of a display panel, which may include steps S110-S160, wherein:

S110, providing a drive back plate with a display area and a peripheral area surrounding the display area, in which the peripheral area has a peripheral drive circuit and a signal line, and the signal line is located at a side of the peripheral drive circuit away from the display area;

S120, forming a first electrode layer at a side of the drive back plate, in which the first electrode layer includes a first electrode located in the display area and a first conductive layer located in the peripheral area and insulated from each other, orthographic projections of the first conductive layer and the peripheral drive circuit on a plane where the drive back plate is located at least partially overlap and are insulated from each other, orthographic projections of the first conductive layer and the signal line on the plane where the drive back plate is located at least partially overlap, and the signal line is connected with the first conductive layer;

S130, forming a pixel definition layer covering the first electrode layer, in which the pixel definition layer includes a pixel definition area located in the display area and a plurality of insulating strips located in the peripheral area; the pixel definition area has a plurality of openings exposing a plurality of first electrodes, the insulating strips are distributed along a direction facing away from the display area, and a separating groove exposing the first conductor is formed between at least two adjacent ones of the insulating strips;

S140, forming a light emitting layer at least in the opening;

S150, forming a second electrode layer that includes a second electrode and a second conductive layer on the same layer as the second electrode, in which the second electrode is disposed at a side of the light emitting layer facing away from the drive back plate, and the second conductive layer covers the insulating strip, forms a recessed area in an area corresponding to the separating groove, and is connected with the first conductive layer;

S160, forming a packaging layer that covers the second electrode layer and fills the recessed area.

The structure of the display panel according to the embodiments of the present disclosure has been described in detail in the above embodiments of the display panel, and specific reference can be made to the above embodiments of the display panel. Meanwhile, the beneficial effects of the manufacturing method according to the embodiments of the present disclosure can also refer to the above embodiments of the display panel, which will not be described in detail here.

In some embodiments of the present disclosure, the source-drain layer and the signal line 130 are formed by the same patterning process. For example, the source electrode 108, the drain electrode 109 and the signal line 130 may be formed by one-time masking process, which may specifically include deposition, gluing, exposure, development, etching and other processes.

It should be noted that, although the various steps of the method of the present disclosure are described in a particular order in the figures, it is not required or implied that the steps must be performed in the particular order, or all the illustrated steps must be performed to achieve the desired result. Additionally or alternatively, some steps may be omitted, or multiple steps may be combined into one step to be performed, and/or one step is decomposed into multiple steps to be performed.

Embodiments of the present disclosure also provide a display device, which includes the display panel of any of the above embodiments, and the specific structure of the display panel can refer to the above embodiments of the display panel, which will not be described in detail here. The display device may be used in a mobile phone, a tablet computer, a television and any other electronic device to display images, which is not limited thereto. It may also be used in other electronic devices with image display functions, such as picture screens, which are not listed herein.

Other embodiments of the disclosure will be apparent to those skilled in the art from consideration of the specification and practice of the disclosure disclosed herein. This application is intended to cover any variations, uses, or adaptations of the disclosure following, in general, the principles of the disclosure and including such departures from the present disclosure as come within known or customary practice in the art to which the disclosure pertains. It is intended that the specification and examples be considered as exemplary only, with a true scope and spirit of the disclosure being indicated by the following claims.

What is claimed is:
1. A display panel, comprising:
a drive back plate having a display area and a peripheral area surrounding the display area;
a peripheral drive circuit in the peripheral area, wherein the peripheral drive circuit comprises a light emitting control circuit, the light emitting control circuit comprises at least one light emitting control circuit signal line;
a signal line in the peripheral area and at a side of the peripheral drive circuit away from the display area;
a first electrode layer disposed at a side of the drive back plate, and comprising first electrodes in the display area and a first conductive layer in the peripheral area, wherein the first conductive layer and the first electrodes are on the same layer and insulated from each other, an orthographic projection of the first conductive layer and an orthographic projection of the peripheral drive circuit are at least partially overlapped on a plane where the drive back plate is located and are insulated from each other, the orthographic projection of the first conductive layer and an orthographic projection of the signal line are at least partially overlapped on the plane where the drive back plate is located, and the signal line is connected with the first conductive layer;
a pixel definition layer comprising a pixel definition area in the display area and insulating strips in the peripheral area, wherein the pixel definition area has openings exposing the first electrodes, the insulating strips are distributed in a direction facing away from the display area, and a separating groove exposing the first conductive layer is formed between at least two adjacent ones of the insulating strips;
a light emitting layer at least disposed within the opening;
a second electrode layer comprising a second electrode and a second conductive layer on the same layer as the second electrode, wherein the second electrode is disposed at a side of the light emitting layer facing away from the drive back plate, the second conductive layer covers the insulating strips and forms a recessed area in an area corresponding to the separating groove, and is connected with the first conductive layer;
a packaging layer covering the second electrode layer and filling the recessed area;
wherein the first conductive layer is provided with through holes exposing the drive back plate, the through holes are distributed in an array, each row of through holes includes at least two through holes, and each of the insulating strips continuously fills all of the at least two through holes in one row of the through holes and at least partially overlaps with the first conductive layer; and
wherein the at least one light emitting control circuit signal line comprises a clock signal line, and the clock signal line comprises a first clock signal line and a second clock signal line adjacent to each other along the direction of distribution of the insulating strips facing away from the display area, the second clock signal line has a signal contrary to that of the first clock signal line, an orthographic projection of one of the insulating strips on the drive back plate at least partially overlaps with an orthographic projection of the first clock signal line on the drive back plate and an orthographic projection of the second clock signal line on the drive back plate; and orthographic projections of at least one row of the through holes covered by said one of the insulating strips on the drive back plate at least partially overlap with the orthographic projection of the first clock signal line on the drive back plate and the orthographic projection of the second clock signal line on the drive back plate.

2. The display panel of claim 1, wherein the insulating strips are substantially parallel and located in a local area of the peripheral area, and an extending direction of the insulating strips is substantially parallel to an edge of the display area corresponding to the local area.

3. The display panel of claim 1, wherein orthographic projections of the first conductive layer and the light emitting control circuit on a plane where the drive back plate is located are at least partially overlapped and are insulated from each other.

4. The display panel of claim 1, wherein the peripheral drive circuit further comprises a gate drive circuit, and the light emitting control circuit is at a side of the gate drive circuit away from the display area.

5. The display panel of claim 1, wherein the at least one light emitting control circuit signal line further comprises a power signal line, the light emitting control circuit further comprises at least one switch unit, the power signal line comprises a first power signal line and a second power signal line having a signal contrary to that of the first power signal line, there is the switch unit between the first power signal line and the second power signal line, one of the first power signal line and the second power signal line is adjacent to the clock signal line, and the orthographic projection of at least one of the first power signal line and the second power signal line on the drive back plate at least partially overlaps with the orthographic projection of at least one of the insulating strips on the drive back plate.

6. The display panel of claim 5, wherein the orthographic projection of at least one of the first power signal line and the second power signal line on the drive back plate at least partially overlaps with an orthographic projection of at least one of the through holes on the drive back plate.

7. The display panel of claim 5, wherein at least part of a structure of the at least one switch unit at least partially overlaps with the orthographic projection of at least one of the insulating strips on the drive back plate.

8. The display panel of claim 5, wherein at least part of a structure of the at least one switch unit at least partially overlaps with the orthographic projection of at least one of the through hole on the drive back plate.

9. The display panel of claim 1, wherein the at least one light emitting control circuit signal line further comprises a starting signal line, the starting signal line comprises a first starting signal line and a second starting signal line adjacent to each other, and the orthographic projection of at least one of the insulating strips on the drive back plate at least partially overlaps with each of orthographic projections of the first starting signal line and the second starting signal line on the drive back plate.

10. The display panel of claim 9, wherein orthographic projections of at least one row of the through holes covered by the same insulating strip on the drive back plate at least partially overlap with each of the orthographic projections of the first starting signal line and the second starting signal line on the drive back plate.

11. The display panel of claim 1, wherein in two rows of the through holes covered by two adjacent ones of the insulating strips, any one of the through holes in one row is located between two adjacent ones of the through holes in another row.

12. The display panel of claim 1, wherein a maximum width of the insulating strip in a width direction is not less than a maximum width of the through hole in the width direction of the insulating strip.

13. The display panel of claim 12, wherein a difference between the maximum width of the insulating strip in the width direction and a width of the through hole in the width direction of the insulating strip is about greater than 0 and not greater than 10 nm.

14. The display panel of claim 12, wherein the maximum width of the through hole in the width direction of the insulating strip is larger than a maximum interval between adjacent ones of the insulating strips in the width direction.

* * * * *